United States Patent [19]

Meyer

[11] Patent Number: 5,502,493
[45] Date of Patent: Mar. 26, 1996

[54] VARIABLE LENGTH DATA DECODER FOR USE WITH MPEG ENCODED VIDEO DATA

[75] Inventor: Edwin R. Meyer, Bensalem, Pa.

[73] Assignee: Matsushita Electric Corporation of America, Secaucus, N.J.

[21] Appl. No.: 246,272

[22] Filed: May 19, 1994

[51] Int. Cl.$^6$ ........................................ H04N 7/12
[52] U.S. Cl. ........................ 348/426; 348/409; 348/419
[58] Field of Search ................................. 348/412, 413, 348/415, 416, 419, 426, 467, 469, 473; H04N 7/12

[56] References Cited

U.S. PATENT DOCUMENTS

| | | | |
|---|---|---|---|
| 4,985,766 | 1/1991 | Morrison | 348/419 |
| 5,220,325 | 6/1993 | Ackland | 341/67 |
| 5,233,348 | 8/1993 | Pollmann et al. | 341/67 |
| 5,249,047 | 9/1993 | Aoki | 348/409 |
| 5,367,629 | 11/1994 | Chu et al. | 348/403 |

OTHER PUBLICATIONS

H. Sun, "Hierarchical Decoder for MPEG Compressed Video Data", *IEEE Transactions on Consumer Electronics*, vol. 39, No. 3, pp. 559–564 (Aug. 1993).
A. Mayer, "The Architecture of a Processor Array for Video Decompression", *IEEE Transactions on Consumer Electronics*, vol. 39, No. 3, pp. 565–569 (Aug. 1993).
A. Netravali et al., "A High Quality Digital HDTV CODEC", IEEE Transactions on Consumer Electronics, vol. 37, No. 3, pp. 320–330 (Aug. 1991).
T. Liu et al., "Hardware Implementation and Cost of Decoders for Digital HDTV", IEEE Transactions on Consumer Electronics, vol. 37, No. 3, pp. 331–336 (Aug. 1991).

*Primary Examiner*—James J. Groody
*Assistant Examiner*—Jeffrey S. Murrell
*Attorney, Agent, or Firm*—Ratner & Prestia

[57] ABSTRACT

The present invention is embodied in a decoder for a video signal encoded according to the standard proposed by the Moving Pictures Expert Group (MPEG) of the International Standards Organization (ISO). This decoder employs four sets of processors, each set containing three processors that operate concurrently to decode the MPEG-2 video signal. A variable length decoder processes the input stream to decode the variable length encoded data. The operations performed by this decoding processor change depending on the type of data being decoded. These changes are implemented using a master Digital Signal Processor (DSP) which is programmed according to the MPEG-2 syntax. The data decoded by the VLD processor is either video data or control data. The control data is divided into two types, control data needed to reproduce the image and control data that describes the bit-stream. The control data needed to decode the image is passed to a control DSP while the control data which describes the bit-stream is passed to the master DSP. To ensure that the entire system can operate with sufficient speed to decode an image in real time, this group of three processors is duplicated four times in the system. Each set of processors operates in parallel and handles digital data representing a distinct portion of the final high definition television image.

14 Claims, 12 Drawing Sheets

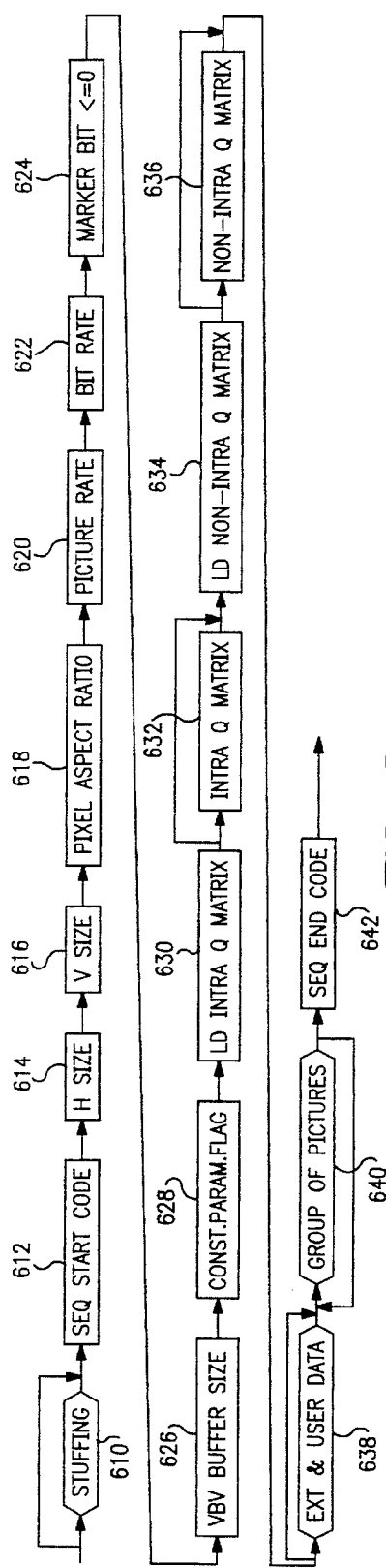
FIG. 6
PRIOR ART
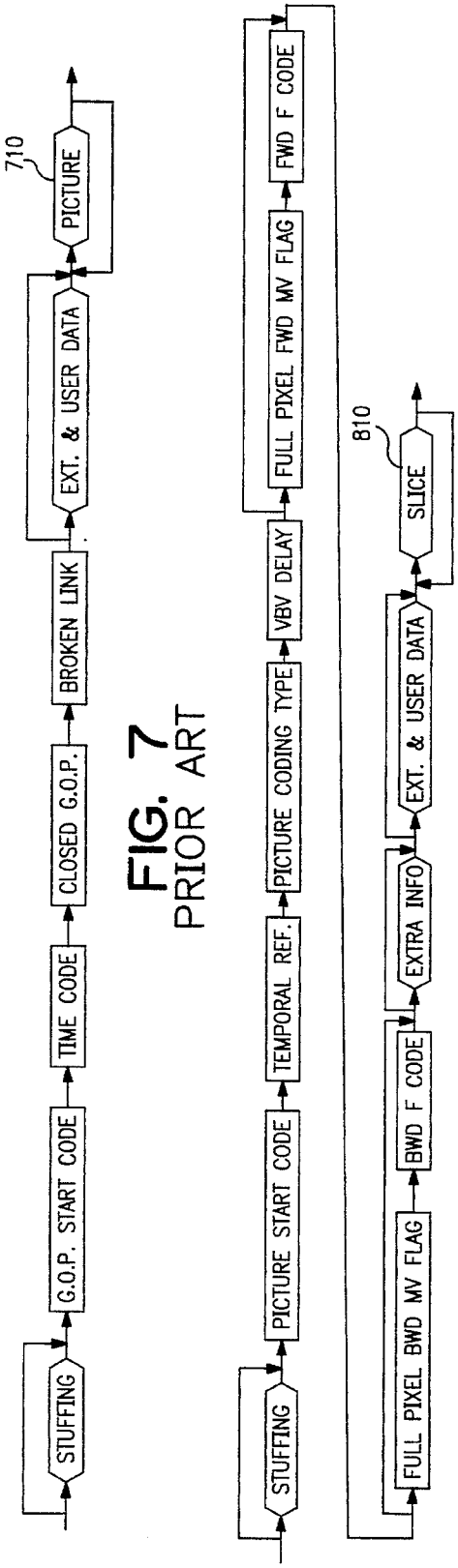
FIG. 7
PRIOR ART
FIG. 8
PRIOR ART

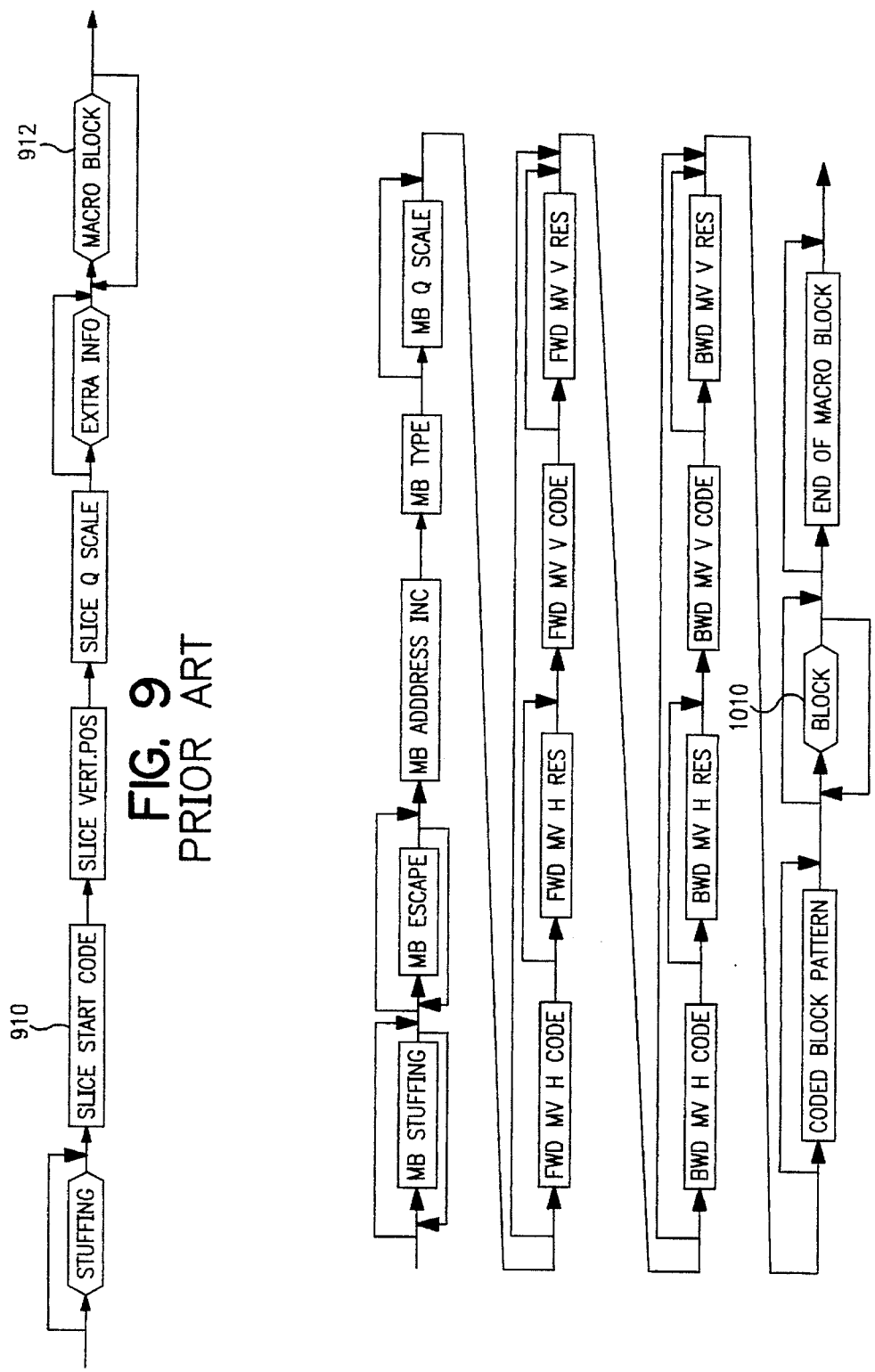

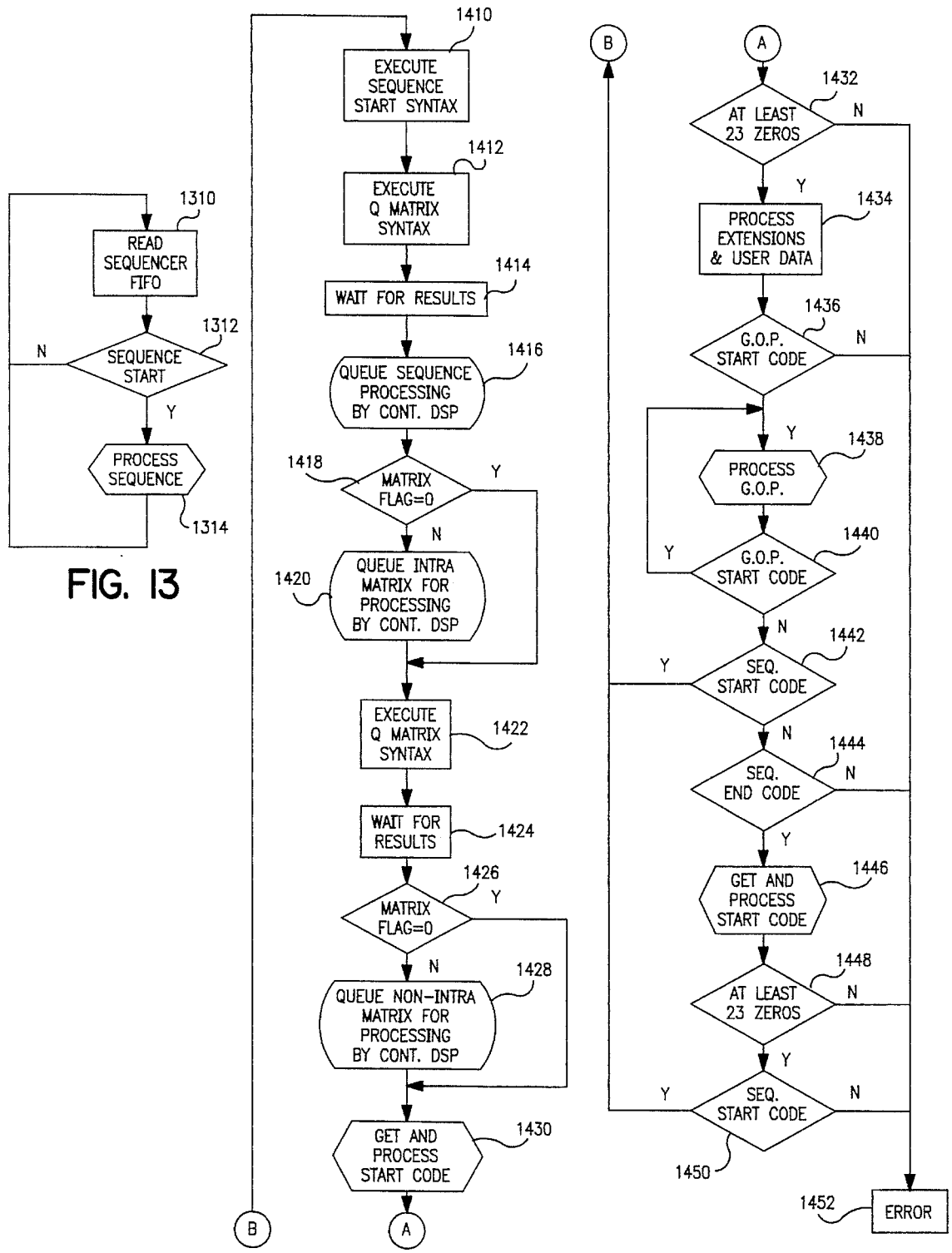

VARIABLE LENGTH DATA DECODER FOR USE WITH MPEG ENCODED VIDEO DATA

FIELD OF THE INVENTION

The present invention relates to decoding of digitally encoded video signals and in particular to a decoder which decodes video signals that have been variably length encoded according to the MPEG-2 standard.

BACKGROUND OF THE INVENTION

In the United States a standard has been proposed for digitally encoded high definition television signals. This standard is essentially the same as the MPEG-2 standard, proposed by the Moving Picture Experts Group (MPEG) of the International Standards Organization (ISO). This standard is described in a draft internal standard (DIS) publication entitled "Information Technology—Generic Coding of Moving Pictures and Associated Audio, Recommendation H.626" ISO/IEC 13818-2 DIS, 3/94 which is available from the ISO and which is hereby incorporated by reference for its teaching on the MPEG-2 digital video encoding standard.

The MPEG-2 standard is actually several different standards. In MPEG-2 several different profiles are defined, each corresponding to a different level of complexity of the encoded image. For each profile, different levels are defined, each level corresponding to a different image resolution. One of the MPEG-2 "standards" known as Main Profile, Main Level is intended for encoding video signals conforming to existing television standards (i.e., NTSC and PAL). Another "standard", known as Main Profile, High Level is intended for encoding high-definition television images. Images encoded according to the Main Profile, High Level standard may have as many as 1,152 active lines per image frame and 1,920 pixels per line.

The Main Profile, Main Level standard, on the other hand, defines a maximum picture size of 768 pixels per line and 567 lines per frame. At a frame rate of 30 frames per second, signals encoded according to this standard have a data rate of 13,063,680 pixels per second. By contrast, images encoded according to the Main Profile, High Level standard have a maximum data rate of 1,152 * 1,920 * 30 or 66,355,200 pixels per second. This data rate is more than five times the data rate of image data encoded according to the Main Profile Main Level standard. The standard proposed for HDTV encoding in the United States is a subset of this standard, having as many as 1,080 lines per frame, 1,920 pixels per line and a maximum frame rate, for this frame size, of 30 frames per second. The maximum data rate for this proposed standard is still far greater than the maximum data rate for the Main Profile, Main Level standard.

Because of this difference in data rates, it is unlikely that the equipment used to decode Main Profile Main Level encoded data will be sufficient to decode high-definition television signals that have been encoded according to the Main Profile, High Level standard.

To be optimally effective, the coding systems should be relatively inexpensive and yet have sufficient power to decode these digital signals in real time.

The MPEG-2 standard defines a complex syntax which contains a mixture of data and control information. Some of this control information is used to enable the signals having several different formats to be covered by the standard. These formats define images, having differing numbers of picture elements (pixels) per line, differing numbers of lines per frame or field and differing numbers of frames or fields per second, In addition, the basic syntax of the MPEG-2 Main Profile defines the compressed MPEG-2 bit stream representing a sequence of images in six layers, the sequence layer, the group pictures layer, the picture layer, the slice layer, the macro block layer, and the block layer. Each of these layers is introduced with control information. Finally, other control information, also known as side information, (e.g. frame type, macroblock pattern, image motion vectors, coefficient zig-zag patterns and dequantization information) are interspersed throughout the coded bit stream.

To effectively receive the digital images, a decoder must recognize the control portions, extract the necessary control information, and use the extracted data to process the video signal information.

Using existing techniques, a decoder may be implemented using a single processor having a complex design and operating at a high data rate to perform this function. While the speed of the processor could be reduced by segmenting the data and processing it in parallel, any reduction in speed would be off-set by an increase in the complexity of the individual processors needed for the parallel channels. This increase in complexity would result from the need to synchronize the various parallel channels.

SUMMARY OF THE INVENTION

The present invention is embodied in a decoder suitable for decoding a high-definition video signal which has been encoded according to the MPEG-2 Main Profile, High Level standard. The portion of this decoder which separates the control information from the video data includes three processors. A variable length decoder parses the input stream to decode the variable-length encoded data in order to recover control data values or coefficient data and run length information where appropriate. The operations performed by this processor change depending on the type of data being decoded. These changes are implemented using a master Digital Signal Processor (DSP). The data decoded by the VLD processor is either video data or control data and the control data is divided into two types: control data used to reproduce the image and control data that is only used to describe the bit-stream. The control data needed to decode the image is passed to a control DSP while the control data which describes the bit-stream is passed to the master DSP. To ensure that the entire system can operate with sufficient speed to decode an image in real time, this group of three processors is duplicated in the system. Each set of processors handles digital data representing a distinct region of the final high definition television image. One of the master DSP's, the grand master DSP, monitors and controls all four of the decoders to synchronize their operation.

BRIEF DESCRIPTION OF THE DRAWINGS

FIG. 6 is a syntax diagram which illustrates the syntax of the sequence layer of the MPEG encoded image which is processed by the decoder shown in FIG. 1.

FIG. 7 is a syntax diagram which illustrates the structure of the group pictures layer defined in the MPEG encoding standard.

FIG. 8 is a syntax diagram which illustrates the syntax of the picture layer defined in the MPEG standard.

FIG. 9 is a syntax diagram which illustrates the structure of the slice layer defined in the MPEG standard.

FIG. 10 is a syntax diagram which illustrates the structure of the macro block layer defined in the MPEG standard.

FIG. 13 is a flow chart diagram which illustrates the operation of the main routine of the master DSP shown in FIGS. 2 and 12.

FIGS. 14a and 14b are flow chart diagrams which illustrate the operation of the PROCESS SEQUENCE routine shown in FIG. 13.

DETAILED DESCRIPTION

While the invention is described in terms of a decoder for image data which has been encoded using the MPEG-2 Main Profile, High Level standard, it is contemplated that it may be used to decode other types of encoded video information in which control information is intermixed with image data.

Overview

The variable length decoder according to the present invention integrates three functions which are desirable for decoding high definition television images which have been encoded according to the MPEG-2 standard. These functions are 1) the decoding of the variable length coded data stream, 2) the separation of the video data information from the control information in this data stream, and 3) the separation of the bit-stream control information and the video control information from the control information stream.

Figure 2:
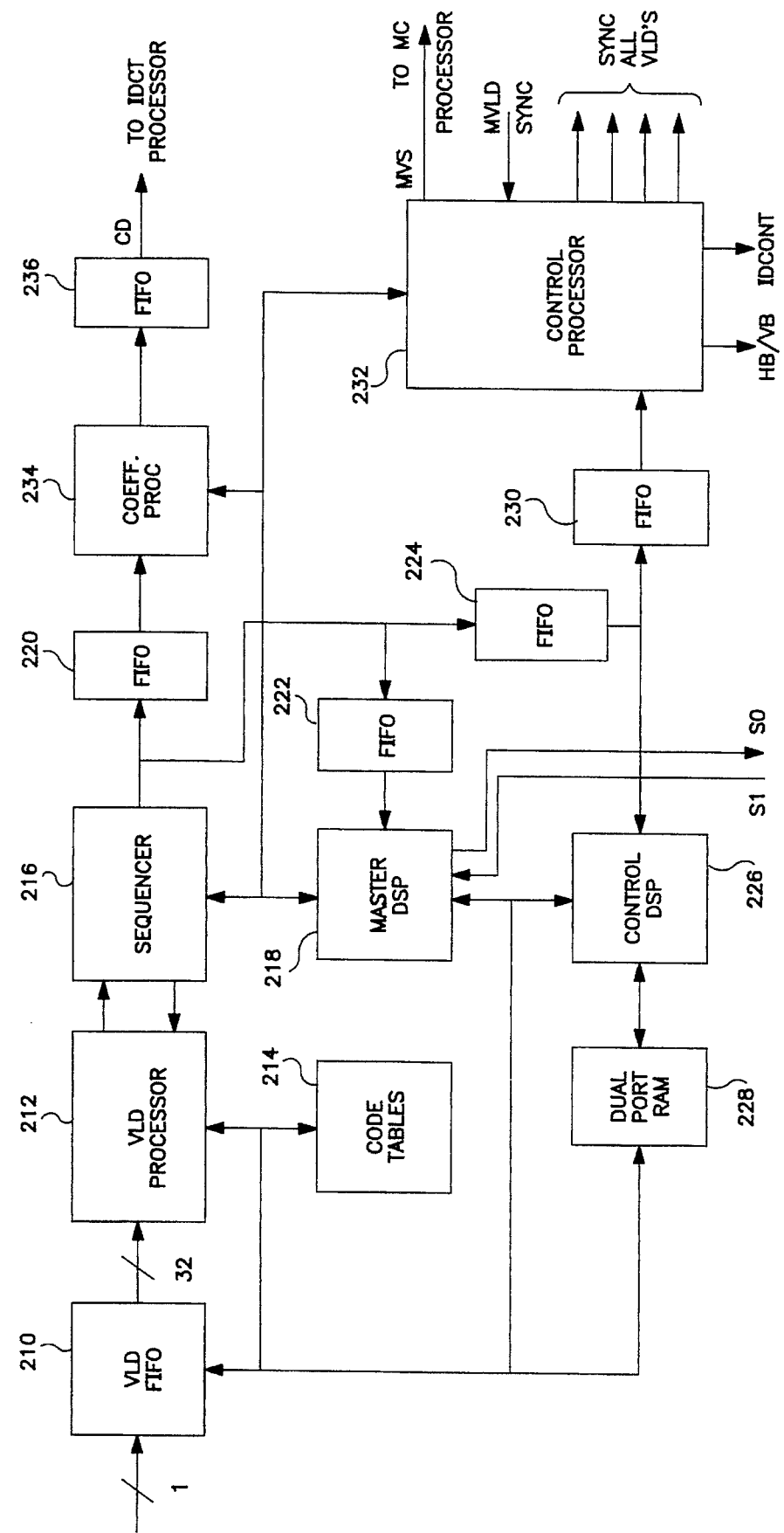
FIG. 2 is a block diagram of a variable length decoder (VLD) suitable for use in the television decoding system shown in FIG. 1.

Referring to FIG. 2, the VLD first-in first-out (FIFO) memory 210 and the VLD processor 212 are controlled by the sequencer 216 to receive the variable length coded bit stream and to regenerate fixed length data values. These data values are provided to respective FIFO memories 220, 222 and 224. FIFO memory 220 passes video signal information to the coefficient processor 234 while the FIFO memories 222 and 224 pass bit stream control information and video control information to the master DSP 218 and control DSP 226, respectively.

For the sake of simplicity, the control signals used by the FIFO memories are omitted in the description of the exemplary embodiments. It is well known by those skilled in the art that the device which writes data into the FIFO provides a control signal, along with the data, to effect the store operation. In the same manner, the device which reads data from the FIFO provides a control signal to the FIFO in order to receive the data. In the exemplary embodiment of the invention, the read and write address values used for many of the FIFO memories are accessible and are monitored by the master DSP 218 to monitor the performance of the decoding system. For the sake of simplifying the drawing figures, the control and data signals used for these monitoring operations are not shown in the drawing Figures. These control functions are well within the skill of a person of ordinary skill in the art of designing real-time digital data processing apparatus.

The master DSP, responsive to the bit stream control information, changes the operation of the sequencer 216 variable length decoding processor 212 and VLD FIFO 210. These changes are made based on the syntax of the digitally encoded bit stream.

The coefficient processor 234 extracts the video data from the FIFO memory 220 and, from this data, it generates blocks of coefficients for use by an inverse discrete cosine transform (IDCT) processor (not shown in FIG. 2). The image control information is extracted from the FIFO memory 224 by the control DSP 226. This information includes quantization tables and motion vectors. The control DSP reformats the quantization tables and the motion vectors, passing the quantization tables to the inverse discrete cosine transform (IDCT) processors, shown in FIG. 1, and passing the motion vectors to the motion compensation processors, also shown in FIG. 1. For synchronization purposes the control DSP 226 routes this information to the IDCT processors and the motion compensation processors through the control processor 232 via the FIFO memory 230. The master DSP for one of the channels is a grand master DSP which, in addition to its functions as a master DSP, also monitors the operation of the entire decoder at key points to ensure that none of the decoding channels loses synchronization and that the decoder stays in step with both the input data stream and the output display device.

This partitioning of the functions of the variable length decoder and the provision for a single controller (i.e. the grand master DSP) in one of the VLD processors which synchronizes all of the decoding circuitry defines a very flexible decoder architecture which may be used to process many different signal formats including those defined under the MPEG-2 standard as well as formats defined under other standards.

DETAILED DESCRIPTION OF THE EXEMPLARY EMBODIMENTS

Figure 1:
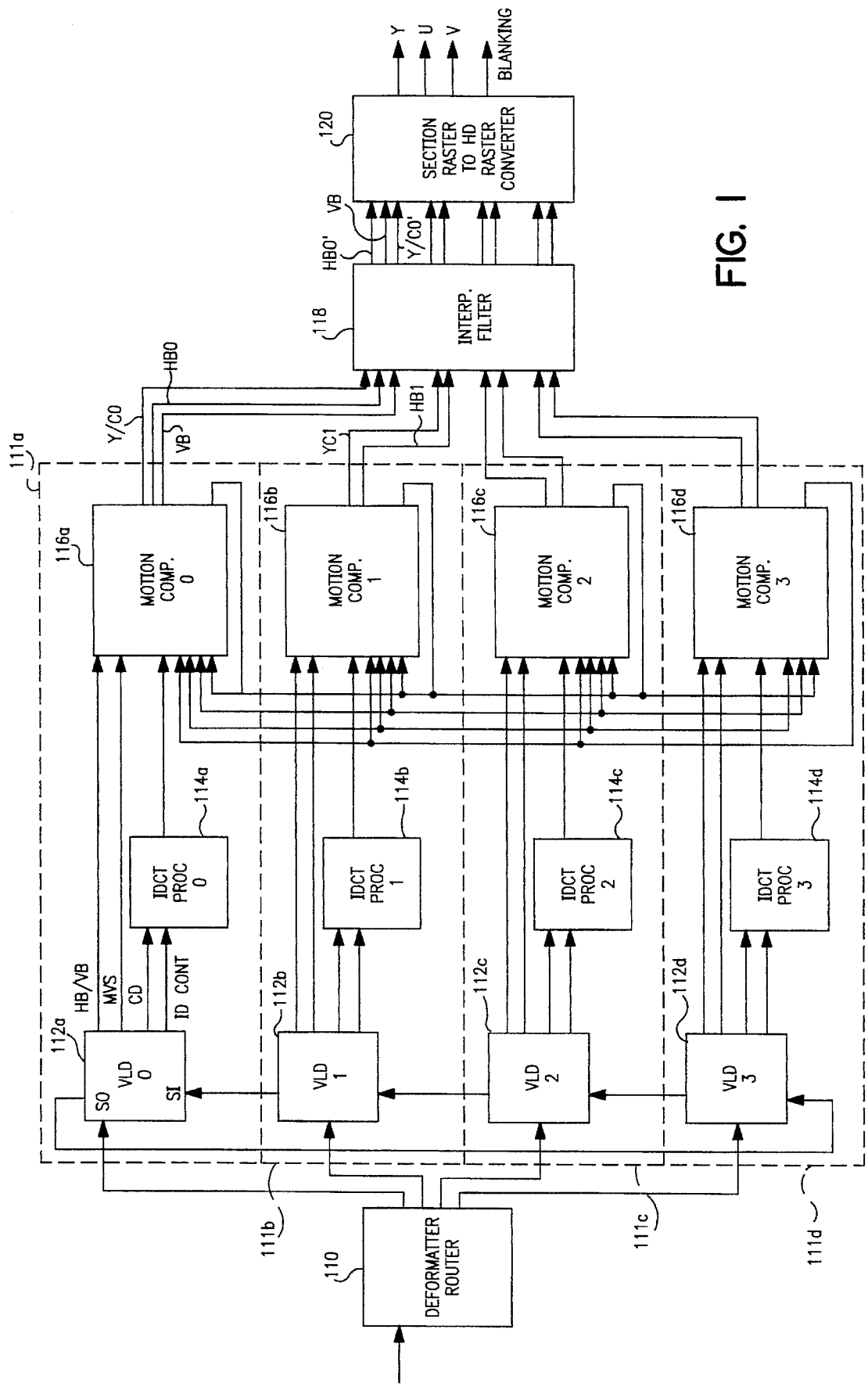
FIG. 1 is a block diagram of a high definition television decoder which includes an embodiment of the present invention.

FIG. 1 is a block diagram of an exemplary HDTV decoding system, which may be used to decode high definition television signals that have been encoded according to the MPEG standard. The diagram shown in FIG. 1 does not address some aspects of the high definition television decoding standard, namely the demodulation of the received HDTV signals to recover the digital data stream.

The decoder shown in FIG. 1, is arranged as four parallel decoders which are coupled to receive separate input data streams from a deformatter/router 110. These data streams are combined in an interpolation filter 118 and a raster converter 120 to produce video signals that are used to drive a high definition monitor (not shown).

In the exemplary embodiment of the invention as shown in FIG. 1, the deformatter/router 110 receives digital HDTV signals as consecutive 8-bit bytes at its input port. The deformatter/router 110 performs two functions, it converts the 8-bit parallel bit stream into a bit serial data stream and it recognizes control information in the data stream down to the slice layer. The recognized control information is passed to all four of the decoders 111a, 111b, 111c and 111d. Each slice start code and the data which follows it are passed to one of the four processors based on the horizontal starting position of the slice in the final image.

To understand the operation of the deformatter/router and of the entire decoder shown in FIG. 1, it is helpful to understand the syntax of an MPEG bit stream and the correspondence between the image data, as represented by the bit stream, and the resulting image.

Figure 4A:
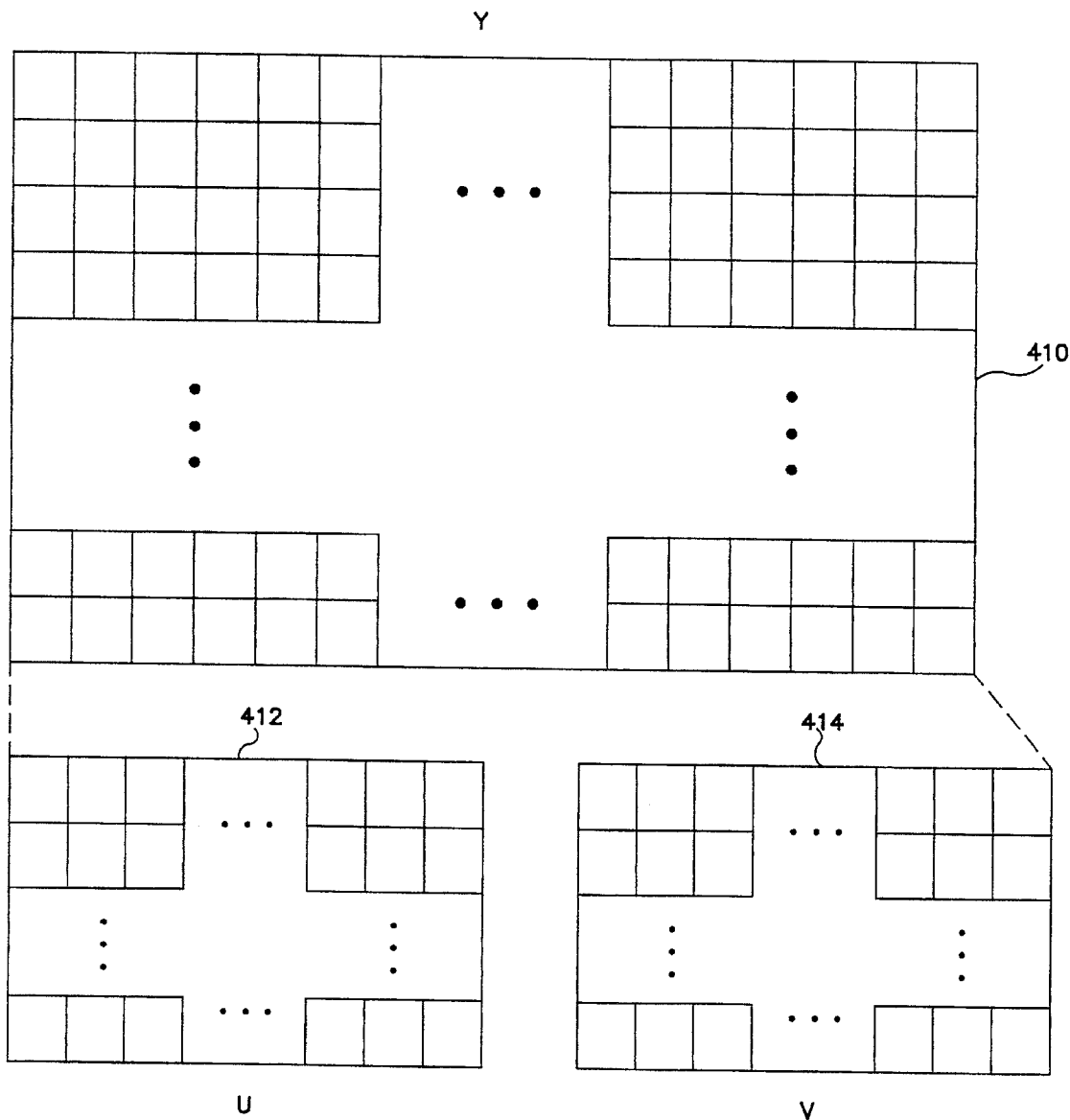
FIGS. 4a and 4b are image map diagrams which are useful for describing the relationship of blocks of pixels to the encoded HDTV image that is processed by the decoder shown in FIG. 1.
Figure 4B:
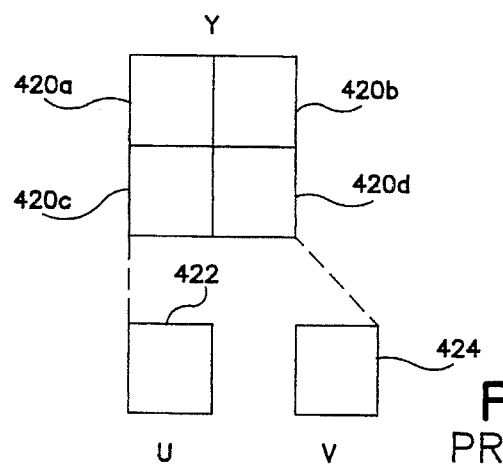

FIG. 4b illustrates the correspondence between two of the basic elements of an MPEG-2 encoded image, the block and the macroblock. The entire structure shown in FIG. 4b is a macroblock. Each of the small squares of which the image is composed, is a block. In each macroblock there are four blocks of luminance information (Y) and one block each of information concerning two color difference signals (U and V). Each block includes 64 coefficient values which are translated by the IDCT processors shown in FIG. 1 into 64 pixel values. Because the human eye is more sensitive to luminance information than to color information, there are four times as many luminance pixels generated than are generated for either of the two color difference signals, U and V.

FIG. 4a illustrates how the blocks of luminance information, Y, and chrominance information, U and V, are combined to generate a high definition television image according to one exemplary coding standard. This standard, which is a modification of the Main Profile, High Level standard defines an image as having 1024 lines of pixels, each line having 1920 pixels.

Figure 5:
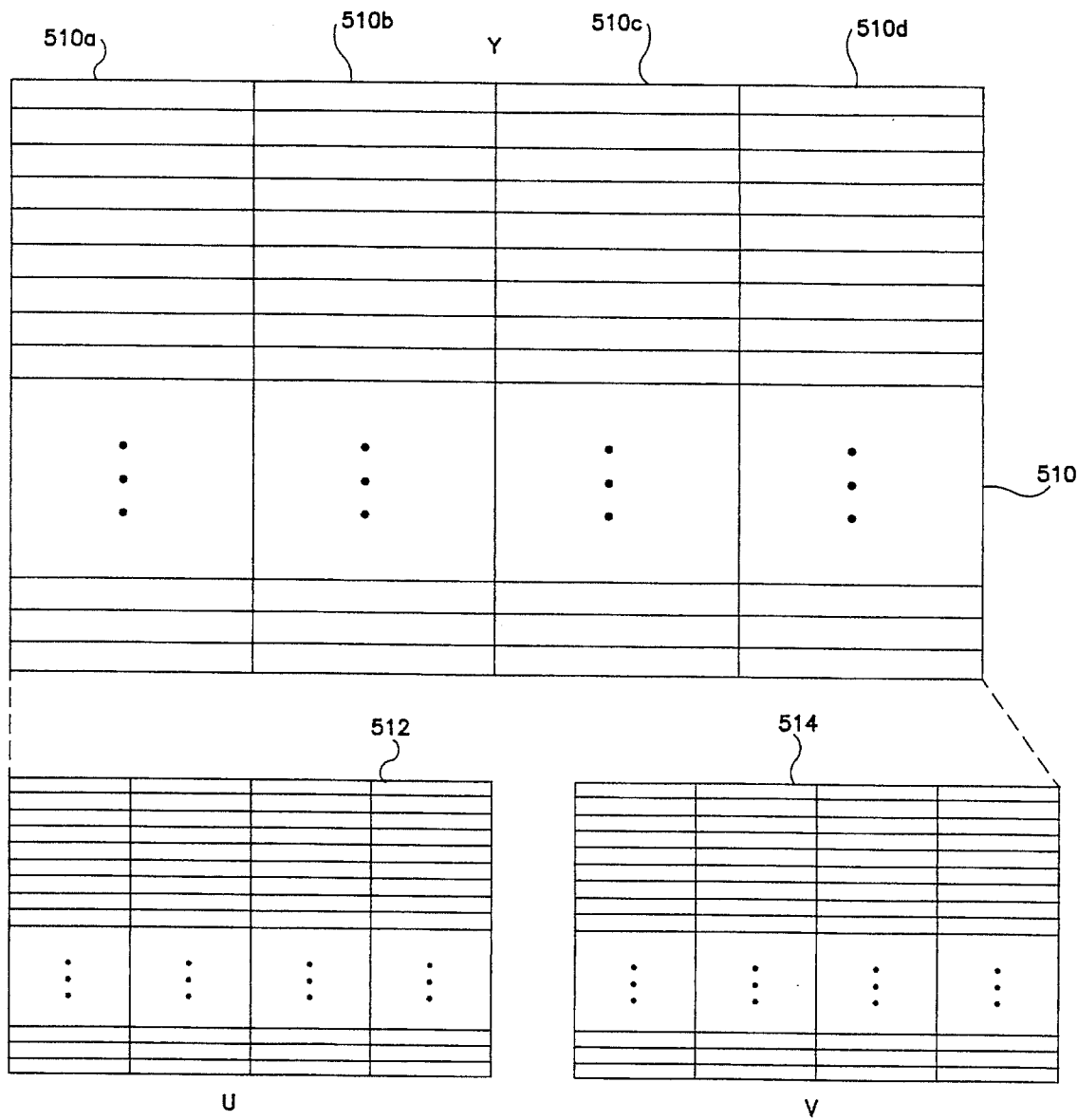
FIG. 5 is an image map diagram which is useful for describing the relationship between image slices and images as processed by the decoding system shown in FIG. 1.

As shown in FIG. 4a, the luminance portion of image may be divided into as many as 128 rows, each row containing as many as 240 blocks. Each of the two color difference image portions is divided into 64 rows, each row including 120 blocks. To make the information more manageable, and to aid an error concealment, in the exemplary embodiment of the invention, the image is encoded as a sequence of slices, each slice corresponding to 30 macro blocks in the reproduced image. This is illustrated in FIG. 5. As shown in FIG. 5, the slices are arranged in a matrix such that there are four slices in each row of the matrix and 64 slices in each column of the matrix. As shown in FIG. 5, the basic unit of the luminance portion of a slice are the four luminance blocks of a macroblock while the basic unit of each of the chrominance portions of a slice is the corresponding block of that chrominance portion block. The luminance and chrominance images are shown as separate images to simplify their description. In an actual image, both luminance and chrominance components are combined in each macroblock.

As described above, the MPEG-2 standard defines 6 layers of information for a sequence of images. These are the sequence layer, the group of pictures layer, the picture layer, the slice layer, the macroblock layer and the block layer. FIGS. 6–11 are syntax diagrams which illustrate the structure of these layers.

These various layers are defined in the abovereferenced document which describes the MPEG-2 standard. Briefly, the sequence layer includes the other five layers. The layers referred to are layers of data. records. Thus, a sequence record includes at least one group of pictures records which, in turn, include at least one picture record and so on, down to the block layer. The sequence layer defines the starting point of a set of images which can be decoded based only on the information following the start of the sequence. The next lower layer is the group of pictures layer. This layer defines a subset of the images contained in the sequence. The images in the group of pictures layer generally include at least one intra-encoded image and several predictively or bidirectionally encoded images. Immediately below the group of pictures layer is the picture layer. The data records at this layer define single frame images. Below the picture layer is the slice layer. Each record at this layer represents a single slice of the image represented by the picture layer record. Below the slice layer are the macroblock and block layers. These layers define successively more basic components of the image, as described above.

FIG. 6 defines the syntax of the sequence layer. In the MPEG-2 description, a sequence defines a series of images which includes at least one group of pictures. The sequence is defined by a sequence start code followed by a set of parameters to be used for the sequence, data for one or more groups of pictures and a sequence end code. Among the parameters that may be provided are quantization matrixes which define how the coefficients in the individual blocks were quantized during the encoding process.

The stuffing entry 610 in the sequence syntax shown in FIG. 6, represents a zero fill operation which may be performed to conform the timing of the bit stream to the display of the video image. If, for example, the preceding sequence contained several frames which could be efficiently encoded, the bit stream may get ahead of the video display. To prevent this from occurring the MPEG-2 standard allows zero bits to be stuffed after the sequence endcode of the preceding sequence and before the sequence start code of the next sequence. As indicated by the arrow bridging step 610, the stuffing operation is optional in the sequence syntax.

The next item in the sequence syntax is the sequence start code. This is defined under the MPEG-2 standard as being 000001B3 in hexadecimal notation. All sequence start codes begin with at least 23 zeros. The value following the 23 zeros determines the type of start code. Table 1 lists start codes which are relevant to the subject invention.

TABLE 1

| Start Code | Hexadecimal Value |
| --- | --- |
| PICTURE | 00000100 |
| SLICE (including | 00000101 |
| vertical | through |
| position) | 000001AF |
| SEQUENCE | 000001B3 |
| GROUP OF PICTURES | 000001B8 |

In addition to these start codes, the sequence, record ends with an end code that has the same general format as a start code. To avoid confusion, any reference in the materials that follow which refers to start codes generally, also refers to the sequence end code.

Following the sequence start code, the first parameter to be defined for the sequence is the horizontal size 614. This value defines a number of picture elements (pixels) in each line of the decoded video image. Following the horizontal size parameter is the vertical size parameter 616. This parameter defines the number of active lines in the decoded video image. The pixel aspect ratio 616 defines the aspect ratio of the decoded high definition television image.

The next item in the syntax, the picture rate 620 defines the number of pictures per second that will be displayed. This ranges from approximately 24 pictures per second to 60 pictures per second. The bit rate parameter 622 is an integer which defines the bit rate of the bit stream measured in units of 400 bits per second. The next item in the syntax is the marker bit. This bit is always set to logic 1. The VBV buffer size parameter 626 is a 10 bit integer which defines the size of the buffer for the video buffering verifier which is needed to decode this sequence.

When the next parameter, the constrained parameter flag 628 is set, certain default maximum parameter sizes are assumed under the MPEG-2 standard. This flag is reset for most HDTV images because the limitations defined when the flag is set correspond roughly to the resolution of an NTSC or PAL image.

Following the constrained parameter flag 628 is the load-intra-quantization-matrix flag 630. If this flag is set then the following 64 eight-bit values in the sequence parameter stream define a quantization matrix to be used for decoding intraframe encoded images. These 64 values are represented by the item 632 in the sequence syntax shown in FIG. 6. If the intra quantization matrix flag 630 is reset, then a default quantization matrix is used for decoding intra-encoded images. This default matrix is defined in the MPEG-2 standard.

The next item in the sequence syntax is the load non-intra quantization matrix flag 634. This flag operates in the same manner as the load intra quantization matrix flag, except that, when the flag is set, the 64 eight-bit values 636 following the flag are used for dequantizing pictures that have been bidirectionally or predictively encoded.

The item in the sequence syntax following the non-intra quantization matrix is extension and user data 638. Extension data is defined by a start code of 000001B5 hexadecimal. The extension data follows this code and continues until another start code is encountered. One start code which may be encountered is the user data start code. In the MPEG-2 standard this is defined as the bit string 000001B2 in hexadecimal. This code identifies the beginning of user data. As with the extension data, this data continues until the receipt of another start code. The extension and user data is provided to allow for expansion and customization of the MPEG-2 standard. As indicated by the arrow bridging block 638, this data is optional. Since this data is not needed to describe the present invention, it is ignored in the materials that follow.

After the extension and user data 638 are one or more groups of pictures 640. As indicated by the backwards arrow bridging item 640 in the syntax diagram, multiple groups of pictures may be defined in this part of the sequence syntax. Following the final group of pictures, however, is a sequence end code 642. This code is defined as the hexadecimal value 000001B7.

Unless the format of the data transmission is well known, decoding may only begin after a sequence start code, and its accompanying parameters, have been encountered in the data stream. To prevent long delays between sequence start codes, it is contemplated in the MPEG-2 standard that these start codes and their associated header blocks may be inserted multiple times in a given sequence. These header blocks may be inserted between alternate groups of pictures.

FIGS. 7–11 illustrate other layers of the syntax. FIG. 7 represents the syntax of the group of pictures item found in FIG. 6. FIG. 7 includes an item 710 labeled PICTURE, which is further defined by the syntax diagram of FIG. 8. FIG. 8, in turn, includes an item SLICE, 810, which is further defined by the syntax diagram of FIG. 9. FIG. 9 includes an item MACROBLOCK 912, which is further defined by the syntax diagram of FIG. 10 and FIG. 10 includes an item BLOCK, 1010 which is further defined by the syntax diagram FIG. 11. These figures are not described in detail because the syntax is available in the above-referenced MPEG-2 document and because the items in the syntax are described below with reference to FIGS. 13–19.

FIG. 1 is a block diagram of a HDTV encoder which includes an embodiment of the present invention. The decoder shown in FIG. 1 is arranged in four parallel decoding channels. In general terms, a deformatter/router 110 divides the demodulated bit stream into four parts, sending one part to each of the four channels, 111*a*, 111*b*, 111*c* and 111*d*. As described below, each of these channels handles slices in respectively different columns, or sections, of the resulting image. The decoded section data provided by the four channels is horizontally interpolated in the interpolation filter 118 and combined in the section raster to high-definition raster converter 120.

The deformatter/router 110 converts the 8 bit HDTV digital signal provided by the HDTV demodulator and digital-decoder (not shown) into a bit serial signal and then processes the signal by detecting start codes. When it detects a start code that represents a sequence, group-of-pictures or picture it transmits all of the information between the detected start code and the next start code to all four of the decoders 111*a*, 111*b*, 111*c*, and 111*d*. When the deformatter/router 110 encounters the first slice code in any vertical position, it sends the slice start code and all information following it (i.e. the slice record) only to decoder 111*a*. When the next slice code is encountered that slice record is sent to decoder 111*b*. The following slice records are sent to decoder 111*c* and 111*d*, respectively. In the MPEG-2 standard, the vertical position of a slice is encoded in the low-order eight-bits of the slice start code. This position value is 1 at the top of the image and, under the MPEG-2 standard, may be as large as 175 (AF hexadecimal) at the bottom of the image.

After processing four consecutive slice records, the next slice record encountered by the deformatter/router—the first slice record at the new vertical position—is again sent to decoder 111*a*. The demultiplexing of the slice codes continues in this manner until a start code other than a slice start code is detected. This detected start code, and the header information which follows it are broadcast to all four decoders as are all other such start codes and headers until a slice start code is encountered. This next slice start code marks the first slice record of a new picture, which is sent to decoder 111*a* beginning the demultiplexing operation again.

As shown in FIG. 5, using the exemplary encoding standard, four consecutive slices span the width of the HDTV image. Due to the demultiplexing performed by the deformatter/router 110, all slices in column 510*a* of the image 510 are processed by decoder 111*a*, all slices in column 510b are processed by decoder 111b all slices in column 510c are processed by decoder 111c and all slices in column 510d are processed by decoder 111d.

Since all of the decoders 111a, 111b, 111c and 111d are identical, only one, decoder 111a is described in detail. Referring to FIG. 1, the demultiplexed bit stream provided by the deformatter/router 110 is applied to a variable length decoder 112a. This decoder provides four output signals, a coefficient data signal, CD, and a control signal, IDCONT, which are convey coefficient data and side information, respectively to the inverse discrete cosine transform (IDCT) processor 114a, a motion vector data and side information data signal MVS, and a horizontal blanking / vertical blanking signal, HB/VB, which are applied to the motion compensation processor 116a.

The coefficient data stream CD provided by the variable length decoder 112a conveys blocks of quantized discrete cosine transform (DCT) coefficients from the variable length decoder to the IDCT processor 114a. The processor 114a then dequantizes the values and performs an inverse discrete cosine transform operation to recover blocks of pixels values which correspond to the blocks of coefficient values which were provided by the variable length decoder. These blocks of pixel values are then applied to the motion compensation processor 116a.

Under the MPEG-2 standard, the macroblocks of pixel values may be either absolute pixel values or differential pixel values. When the macroblocks contain differential values, the corresponding macroblock also includes motion vector information. This motion vector information is decoded by the variable length decoder 112a and is provided, via the signal MVS, to the motion compensation processor 116a. The motion compensation processor 116a uses the absolute or differential pixel information and, optionally, the motion vector information to recover absolute pixel values for the image slices. These pixel values are provided by the motion compensation processor 116a to the interpolation filter 118.

Depending on the horizontal size of the input image, the interpolation filter 118 expands the image to fit the aspect ratio of the receivers display device. In the exemplary embodiment of the invention, the luminance component, Y, of the image is only expanded horizontally by the interpolation filter 118. The chrominance components are expanded both horizontally and vertically by a factor of two to produce a number of chrominance samples of each the U and V color difference signals which matches the number of samples of the interpolated luminance signal. It is contemplated, however, that the interpolation filter 118 may be adapted to perform both horizontal and vertical interpolation on all of the image components, Y, U and V.

The output signal provided by the interpolation filter 118 is applied to section-raster to high-definition-raster converter 120. Converter 120 combines the various interpolated section signals to produce samples representing the luminance signal, Y and two color difference signals, U and V in proper raster format for display on the receiver's display device (not shown). In addition, the converter 120 generates a composite blanking signal for the receiver's display device.

FIG. 2 is a block diagram of a VLD decoder suitable for use as the decoder 112a shown in FIG. 1. The VLD decoding operation is controlled by a master digital signal processor (DSP) 218. As described below, this processor monitors the performance of various elements in the decoder 111a and issues commands for a sequencer 216, a control DSP 226 and a control processor 232.

In addition, the DSP 218, as the master DSP of decoder channel 111a, is the grand master DSP of the system shown in FIG. 1. In addition to the control functions described above, the grand master DSP also monitors the performance of all of the other channels 111b, 111c and 111d to ensure that data is not decoded faster than it can be displayed. In the exemplary embodiment of the invention, the grand master DSP 218 monitors the performance of the four decoding channels using data conveyed among the four DSP's via a serial bus. The serial bus interfaces with each of the DSP's via the terminals SI and SO.

In FIG. 2, the bit serial stream from the deformatter/router 110 is received by the VLD FIFO memory 210. FIFO memory 210 reformats the bit serial data stream into 32-bit words and stores the words until they are requested by the VLD processor 212. As described in detail below, the header for the picture layer of the MPEG-2 bit stream includes a parameter VBV DELAY which specifies an amount of data which needs to be stored into the VLD FIFO memory 210 before processing may begin.

In the exemplary embodiment of the invention, The master DSP 218 monitors the read and write addresses used by the VLD FIFO memory 210 to determine when the prescribed amount of data has been stored into the FIFO 210. Alternatively, the FIFO memory 210 may include circuitry which indicates to the master DSP 218 the amount of data it holds. When the FIFO memory 210 holds an amount of data sufficient to satisfy the VBV delay, the master DSP 218 signals the VLD processor 212 to begin extracting data from the VLD FIFO memory 210.

The VLD processor 212 is controlled by the sequencer 216. Sequencer 216 is a conventional microprogrammed controller. It includes a memory (not shown) which holds all of the microprogrammed processes which may be executed by the sequencer 216. The master DSP 218, responsive to the decoded bit stream, directs the sequencer 216 to perform various decoding processes consistent with the MPEG-2 syntax.

When the VLD processor first begins operation, the master DSP 218 does not have sufficient information on the MPEG-2 bit stream to know which decoding operations should be performed. In order to establish synchronization, the sequencer 216 has a start-up mode in which it controls the VLD processor 212 to locate start codes and then to provide the start codes to the master DSP 218. Master DSP 218 then processes these start codes until it locates a sequence start code. At this point, it resets the sequencer 216, VLD processor 212, control DSP 226 and control processor 232 and begins commanding the sequencer 216 and VLD processor 212 to decode the MPEG-2 bit stream.

The VLD processor uses code tables 214 as commanded by the master DSP 218 via the sequencer 216 to translate the variable length input bit stream into control information and image data. The code tables 214 include several code tables which are defined under the MPEG-2 standard. Also included are code tables which are used by the VLD processor 212 to aid in the decoding of fixed-length words in the data stream such as start codes.

A detailed description of the VLD processor 212 is presented below with reference to FIG. 3. A description of various decoding operations performed by the VLD processor is presented below with reference to FIGS. 13–19.

As described above, the MPEG-2 bit stream includes several components: bit-stream control information, image control information and image data. Bit-stream control information, which is encountered by the VLD processor 212 and sequencer 216, is written into a FIFO memory 222, which is read by the master DSP 218. When image control information is encountered, it is written into a FIFO memory 224, which is read by the control DSP 226. Image data information is provided by the processor 212 and sequencer 216 to a FIFO memory 220, which is read by a coefficient processor 234.

The coefficient processor 234 reconstructs the quantized DCT coefficients in each block of the image from code values and run-lengths provided by the VLD processor 212 and sequencer 216. These quantized coefficients are provided to the IDCT processor 114a via a FIFO memory 236.

In the exemplary embodiment of the invention, the control DSP 226 decodes the motion vector data and quantization information and passes it to the IDCT processor 114a and motion compensation processor 116a via the control processor 232. The control DSP 226 writes the decoded data into a FIFO memory 230 which is read by the control processor 232. The control processor 232 is controlled, in turn, by the master DSP 218 so that the data will not be sent unless the processors 114a and 116a have sufficient capacity to receive the data.

To provide memory storage and communications for processing operations, the master DSP 218 and control DSP 226 are coupled to a dual-port memory 228.

Figure 3:
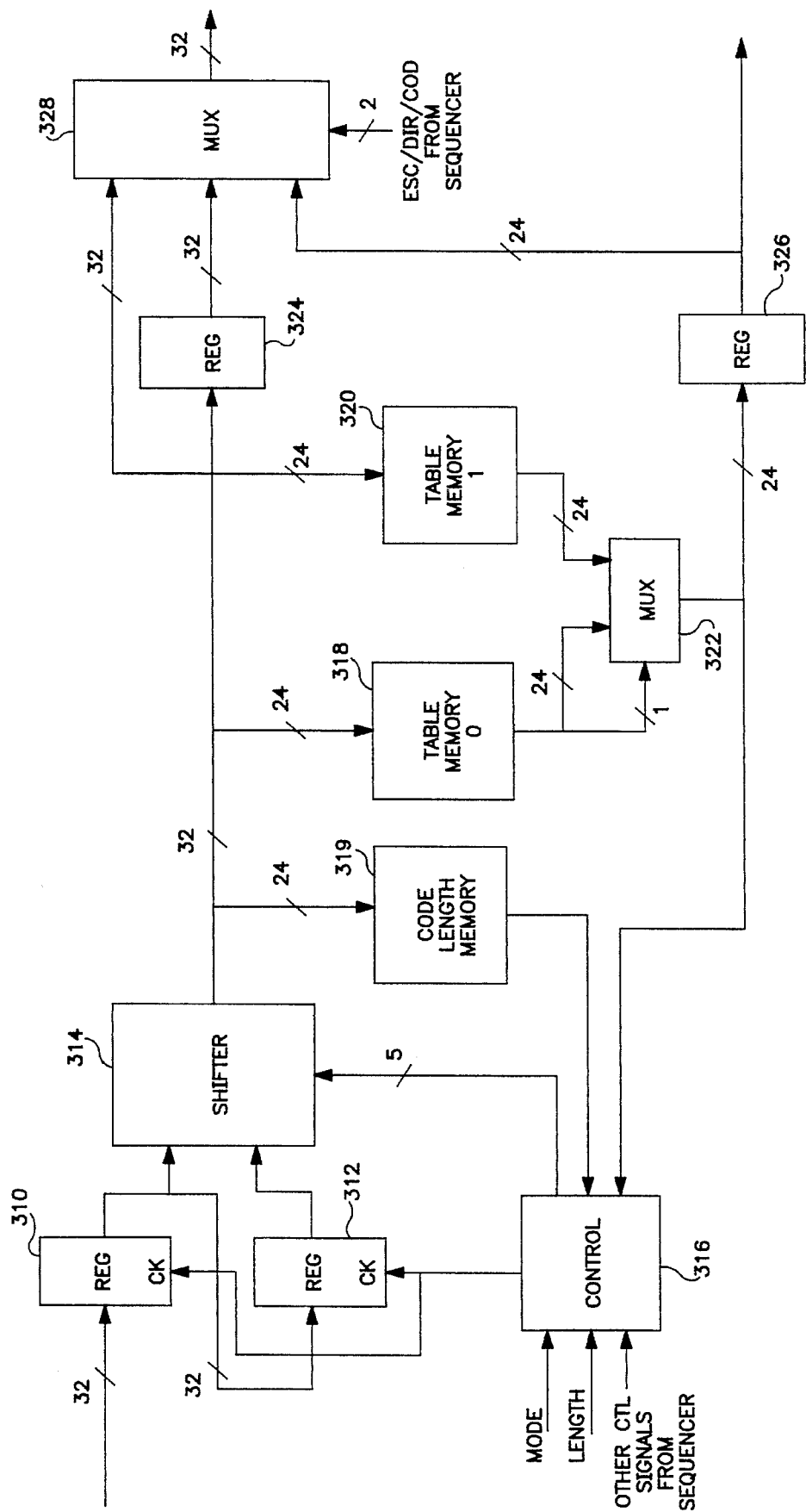
FIG. 3 is a block diagram of a VLD processor suitable for use in the variable length decoder shown in FIG. 2.

FIG. 3 is a block diagram of a VLD processor suitable for use as the processor 212, shown in FIG. 2. The 32-bit data values provided by the VLD FIFO 210 of FIG. 2 are applied to a register 310, shown in FIG. 3. The register 310 provides its value, in parallel to one input port of a shifter 314 and to a second register 312. The registers 310 and 312 are responsive to a single clocking signal CK, provided by control circuitry 316 such that the register 312 holds the value that was previously held by the register 310. Thus, the registers 310 and 312, together apply 64 bits of the bit-stream to the shifter 314.

The shifter 314 is responsive to a five-bit signal provided by the control circuitry 316 to shift the 64 bit value by between 0 and 31 bit positions and to provide the 32 most significant bits (MSB's) of the bit-shifted value as an output value. Thus, any sequence of 32 bits from the 64 bits applied to the input port of the shifter 314 may be provided at the output port of the shifter.

The output values provided by the shifter 314 are applied in parallel to two variable length code memories, 318 and 320, to a code length memory 319, to a register 324 and to one data input port of a multiplexer 328. The other data input ports to the multiplexer 328 are coupled to receive the output values provided by the register 324 and output values provided from the VLC code memories 318 and 320 via a multiplexer 322 and register 326. The control circuitry 316 is also responsive to code length values provided by the code length memory 319. For conventional VLC code words, these code length values are used by the control circuitry 316 to determine the amount by which the shifter 314 shifts the data stream, and when the registers 310 and 312 are clocked to advance the bit-stream in the decoder.

As shown in FIG. 3, the multiplexer 328 is controlled by a control signal ESC/DIR/COD provided by the sequencer 216, shown in FIG. 2. This control signal allows the multiplexer to provide one of three types of words, escape, direct or code, that may be encountered in the bit stream. These different types of words are described in the above-referenced MPEG-2 document. Briefly, code words are variable-length encoded values which are the most common component of the bit-stream. In the exemplary embodiment of the invention, these code words are provided from the code memories 318 and 320 via the register 326. At the same time, the length of the variable length code value is produced by the code length memory 319 and passed to the control circuitry 316 so that the variable length code value may be deleted from the bit-stream. When the MPEG-2 syntax indicates that a variable length code value is to be received, the sequencer causes the multiplexer 328 to pass the value provided by the register 326.

Occasionally, the encoder, will need to send a value, as a variable length encoded value, which does not appear in the variable length code table. In this instance, the encoder inserts a code value which represents an escape sequence into the bit stream. This escape sequence value is followed by the actual unencoded data value to be sent. When an escape sequence is encountered by the VLD processor 212, the decoder first decodes the escape sequence and sends this to the sequencer 216 via the register 324. When the control circuitry 316 has shifted the escape sequence from the bit-stream, the escape data value is provided by the shifter 32. In this instance, the sequencer causes the multiplexer 328 to pass the output signal of the shifter, and provides the appropriate number of bits from this output signal as the escape value. The sequencer then sends a length value to the control circuitry 316 to cause it to delete the escape data value from the bit stream.

The direct mode is used when it is known that the next item in the sequence is not variable length encoded, for example for the data values sent in the headers of the various layers of the MPEG-2 syntax. As defined in the MPEG-2 syntax, a direct value may have any length from 1 -bit to 32 -bits. The master DSP 218 is programmed according to the MPEG-2 syntax and causes the sequencer 216 to execute the proper code to recognize and process components of the MPEG-2 syntax. When a direct value is known to be the next item in the syntax, the sequencer 216 switches the multiplexer 328 to pass the data provided by the register 324.

Since the master DSP 218 controls the operation of the VLD decoder and—as grand master DSP—controls the operation of the entire decoder, the operation of the entire decoding system can be described by describing the operation of the master DSP 218. In the exemplary embodiment of the invention, the both the master DSP 218 and the control DSP 226 are TMS320C30-40 devices, available from Texas Instruments.

Figure 12:
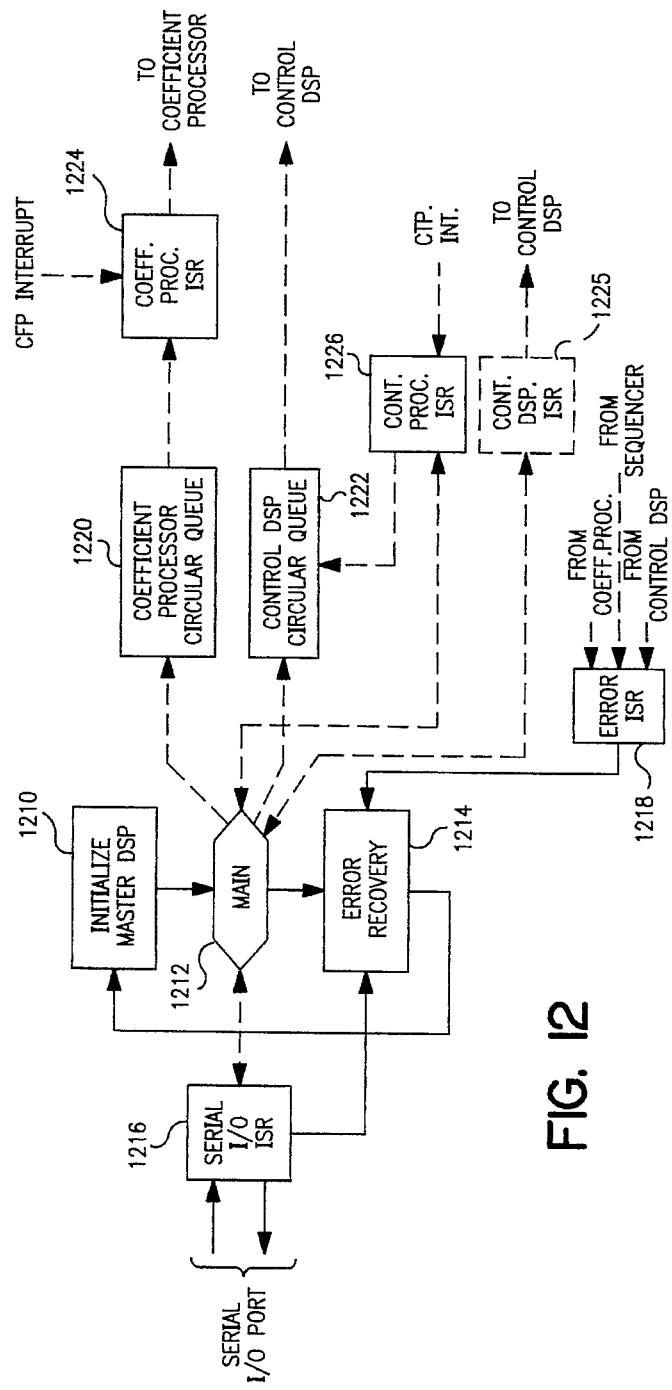
FIG. 12 is a data flow diagram which is useful for describing the operation of the master DSP used in the variable length decoder shown in FIG. 2.

FIG. 12 is a data-flow diagram which illustrates the operational flow of the master DSP 218. In FIG. 12, the central data path are the steps INITIALIZE MASTER DSP 1210, MAIN 1212 and ERROR RECOVERY 1214. The step INITIALIZE MASTER DSP is executed at system start-up and after error recovery when a fatal error has been encountered. This step clears all information on the current state of the processor, synchronizes the master DSP 218 with the master DSPs in the other three variable length decoders, and causes the sequencer 216 and VLD processor 212 to enter a mode in which they are searching for start codes.

Once the system is initialized, the step 1212 is executed. This step represents the main processing loop of the master DSP 218. This loop is described below in greater detail with reference to FIGS. 13 through 19.

As shown in FIG. 12, the main processing loop 1212 is responsive to interrupt signals (shown as dashed-line arrows) from a serial input/output (I/O) interrupt service routine (ISR) 1216, a control processor ISR 1226, a coefficient processor (CFP) ISR 1224, and, optionally, a control DSP ISR 1225 (shown in phantom). The I/O ISR 1216, control processor (CTP) ISR 1226, CFP ISR 1224, and control DSP ISR 1225, with their respective interrupts, allow the master DSP to schedule and track the processing of the VLD decoder.

In operation, the sequencer 216, in response to the master DSP 218, parses the bit stream and provides the parsed data values to FIFOs 220, 222, and 224. The master DSP uses the data values in FIFO 222 to control continued parsing of the bit stream. The master DSP, in response to data values in the bit stream, queues processing commands to be executed by the coefficient processor 234 and the control DSP 226. The master DSP initiates execution of the processing commands to be executed by the coefficient processor 234 and/or the control DSP 226 if after queuing a command it is determined that the control DSP 226 or the coefficient processor 234 are not busy. Either one of the coefficient processor 234 or the control DSP 226 or both may start execution. Then, the master DSP continues to control the parsing process of the bit stream to stay in advance of the real time video scan generated by the control processor.

The coefficient processor 234, in response to the processing command from the master DSP, processes one macro block of data from FIFO 220 which is subsequently provided to FIFO 236. Then, the coefficient processor 234 interrupts the master DSP via the CFP ISR 1224. If additional processing is to be performed, for example, if the master DSP has queued an additional command for the coefficient processor 234, the CFP ISR 1224 provides the next command to the coefficient processor 234. If however, FIFO 236 is full, further processing by the coefficient processor 234 will be suspended until the data is read out from FIFO 236. The amount of data in FIFO 236 is determined by a counter (not shown). The counter indicates if the FIFO 236 is full.

The control DSP functions in a similar manner to the coefficient processor 234. When a processing command has been provided to the control DSP 226, the control DSP processes the command removing data from FIFO 224 and subsequently providing the processed data to FIFO 230. If an interrupt had been used to initiate the processing by a queued command from the master DSP, the control DSP ISR 1225 determines if additional command are available. If additional commands are not available, no further processing is performed. Alternatively, if the control DSP ISR has not been used to provide an interrupt, the control processor ISR 1226 provides a new command to the control DSP 226 each time the control DSP 226 retrieves data from FIFO 230.

The master DSP has a counter for determining if FIFO 230 is full. If FIFO 230 is full, then processing by the control DSP 226 is suspended until data is read out from FIFO 230.

The control processor is activated after the master DSP has processed and provided an adequate amount of the bit stream data to FIFOs 220, 222, and 224, including the VLD FIFO, so that FIFOs 220, 222, and 224, including the VLD FIFO, will not underflow. The control processor 232 generates HB, VB and timing signals for each macro block. The timing signals are used to read out control information from FIFO 230 and coefficient data from FIFO 236 for each macro block every 320 clocks. The retrieved data is provided to the IDCT processing and motion compensation processor.

The control processor, after retrieving each macro block, generates an interrupt that is provided to the CTP ISR 1226. The CTP ISR 1226 uses the interrupt to adjust a count so that the fullness of FIFOs 230 and 236 may be determined. If the coefficient processor 234 or the control DSP 226 has suspended processing because their respective FIFOs 236 and 230 are full, the CTP ISR 1226 will restart the coefficient processor 234 and the control DSP 226 because additional room is now available in their respective FIFOs.

However, if the CTP ISR determines that the FIFOs are in underflow, an error routine is initiated. Once started, the operation of the control processor is not suspended except for errors.

The error recovery routine 1214 handles internal system faults and instances where syntax errors are encountered in the bit-stream. In the exemplary embodiment of the invention, the error recovery routine performs data logging functions to aid in locating and correcting the error while the system is off-line. In an exemplary system for use by the public, this routine may log the error and attempt to restart the system immediately.

FIGS. 13 through 19 are flow-chart diagrams which illustrate the operation of the master DSP 218. These diagrams describe the operation of the variable length decoder 111*a* in decoding the bit-stream from system initialization down to the decoding of a block of coefficient values of intra-frame encoded data.

FIG. 13 shows the operation of the main loop 1212 immediately after the master DSP 218 has been initialized. The first step in this process is to read the sequencer FIFO at step 1310. As described above, during the initialization process, the sequencer 216 is placed in a mode in which it searches for start codes in the bit-stream and reports the start codes to the master DSP 218. The operation of the sequencer 216 and VLD processor 212 is illustrated by the microcode listing of Table 2.

TABLE 2

| Step | Command | Destination | Mode | Length | Table No. |
|------|---------|-------------|------|--------|-----------|
| 1 | NOP | none | D | | 1F |
| 2 | Xfer to EOB | none | LE | | 1F |
| 4 | NOP | none | D | | 1E |
| 5 | Xfer to EOB | MD | LNE | | 1E |
| 6 | send | MD | D | 8 | |

This table describes the steps performed by the sequencer 216 and VLD processor 212 in the start-up mode. At step 1, the processor 212 is instructed which table in the table memories 318 and 320 is to be used to decode the received data. The tables 1E and 1F are tables that have been specially defined for this function. They are not VLC tables defined in the MPEG-2 standard. The designators 1E and 1F are the hexadecimal numbers of the tables in the memories 318 and 320. The contents of these code tables are shown in Table 3, below.

TABLE 3

| code | | | | EOB Flag | Code Value |
|------|------|------|------|----------|------------|
| (code table 1E) | | | | | |
| 00 | 0000 | 0000 | 0000 | 0 | 14 |
| 00 | 0000 | 0000 | 001- | 1 | 13 |
| 00 | 0000 | 0000 | 01-- | 1 | 12 |
| 00 | 0000 | 0000 | 1--- | 1 | 11 |
| 00 | 0000 | 0001 | ---- | 1 | 10 |
| 00 | 0000 | 001- | ---- | 1 | 9 |
| 00 | 0000 | 01-- | ---- | 1 | 8 |
| 00 | 0000 | 1--- | ---- | 1 | 7 |
| 00 | 0001 | ---- | ---- | 1 | 6 |
| 00 | 001- | ---- | ---- | 1 | 5 |
| 00 | 01-- | ---- | ---- | 1 | 4 |

TABLE 3-continued

| code | | | | EOB Flag | Code Value |
|---|---|---|---|---|---|
| 00 | 1- - - | - - - - | - - - - | 1 | 3 |
| 01 | - - - - | - - - - | - - - - | 1 | 2 |
| 1- | - - - - | - - - - | - - - - | 1 | 1 |
| | | | (code table 1F) | | |
| - - | - - - - | - - - - | - - -1 | 0 | 14 |
| - - | - - - - | - - - - | - -10 | 0 | 13 |
| - - | - - - - | - - - - | -100 | 0 | 12 |
| - - | - - - - | - - - - | 1000 | 0 | 12 |
| - - | - - - - | - - -1 | 0000 | 0 | 10 |
| - - | - - - - | - -10 | 0000 | 0 | 9 |
| - - | - - - - | -100 | 0000 | 0 | 8 |
| - - | - - - - | 1000 | 0000 | 0 | 7 |
| - - | - - -1 | 0000 | 0000 | 0 | 6 |
| - - | - -10 | 0000 | 0000 | 0 | 5 |
| - - | -100 | 0000 | 0000 | 0 | 4 |
| - - | 1000 | 0000 | 0000 | 0 | 3 |
| -1 | 0000 | 0000 | 0000 | 0 | 2 |
| 10 | 0000 | 0000 | 0000 | 0 | 1 |
| 00 | 0000 | 0000 | 0000 | ` | 14 |

The sequencer 216 controls the VLD processor 212 in response to the microcode listed above in Table 2 and the VLC codes shown in table 3 in the following manner. At step 1, the sequencer 216 commands the processor 212 to use the code table 1F to decode the bit stream. At step 2, the processor 212 is instructed to transfer data in the bit-stream until an end of block (EOB) flag is encountered. Referring to Table 3, an EOB flag is encountered only when a string of 14 zeros is encountered in the bit stream. When this string is encountered, control passes to step 3. In this step, the VLD processor 212 is instructed to use table 1E in its decoding operations. At step 4, the processor 212 is again instructed to scan the bit stream until an EOB flag occurs. Referring to table 3, as long as the bit-stream includes only zeros, there will be no EOB flag. As each group of 14 zeros is scanned, the VLD processor 212 transmits the value 14 to the master DSP 218. This occurs because the mode of the VLD processor 212 is set to look-up no escape (LNE). At the end of step 4, the VLD processor 212 transfers the corresponding code value (i.e. the number of zeros before the one) to the master DSP 218. This code value is stored in one field of a word. In this instance, the word also contains an end of block (EOB) flag. At step 5, the VLD processor 212 sends the next eight bits to the master DSP 218. If the zero count values passed to the master DSP 218 total at least 23, then this eight-bit value is the eight LSB's of a start code.

While the VLD processor 212 is parsing the bit stream, the master DSP 218, at step 1310 of FIG. 13 is receiving and summing the provided count values and receiving the eight LSB's of the start code. At step 1312, the master DSP determines if the VLD processor 212 has processed at least 23 zeros prior to receiving the provided start code value. If so, then the value is identified as being a start code. Also at step 1312, the master DSP 218 determines if the eight-bit value is B3 hexadecimal. If so, then the start code is a sequence start code and control passes to step 1314 to process the sequence. Otherwise, at step 1312, the master DSP 128 signals the sequencer to continue processing from step 1 of table 2. This continues until a sequence start code is encountered.

FIGS. 14a and 14b are a flow-chart diagram which shows the steps performed by the master DSP for the PROCESS SEQUENCE routine. This routine follows the syntax of the sequence layer described above with reference to FIG. 6. In the first step of this process, step 1410, the master DSP 218 commands the sequencer 216 and VLD processor 212 to extract some of the parameters from the sequence header. These parameters include the horizontal size, vertical size, aspect ratio, picture rate, bit rate, marker bit, VBV buffer size and constrained parameter flag. The microcode for this operation is a sequence of direct transfer operations and is not described herein.

Next, at step 1412, the master DSP 218 instructs the sequencer 216 and VLD processor 212 to execute the microcode that extracts the intra quantization matrix from the sequence header if one exists. The microcode for this operation tests the next bit in the bit stream. If this bit is a zero, then the sequencer 216 signals an illegal instruction, stops execution of the microcode and returns the zero value to the master DSP 218, via the FIFO memory 222. If the next bit in the bit stream is a one, then there is an intra quantization matrix in the header. In this instance, the sequencer 216 returns the one value to the master DSP 218 and then commands the VLD processor 212 to extract 64 eight-bit direct values from the bit stream and to transfer these values to the FIFO memory 224 for use by the control DSP 226.

While the sequencer 216 and VLD processor 212 are executing this microcode, the master DSP is executing step 1414 in which it waits for the results of the VLD processing. When the sequencer 216 signals that the requested processing steps have been performed, the master DSP, at step 1416 enters an item in the circular queue 1222 (shown in FIG. 12) for the control DSP 226, to command the control DSP to perform the necessary processing steps on the sequence header data. Depending on the particular implementation, the control DSP 226 may process some of the fixed header information which comes before the quantization matrix in the sequence header. Alternatively, as shown in FIG. 12, the master DSP 218 may interrupt the control DSP 226 via the ISR 1226 to cause the control DSP to process the sequence header data. This alternative of using an interrupt instead of the queue 1222 applies to other control operations, described below, which are performed by the master DSP 218 on the control DSP 226.

If, at step 1418, the matrix flag value, returned to the master DSP 218 by the sequencer 216, is set, the master DSP, at step 1420 places an entry in the queue 1222 to command the control DSP 226 to process the quantization matrix. In response to this request, the control DSP fetches the quantization matrix data stored in the FIFO memory 224 by the sequencer 216 and passes this data to the IDCT processor 114a, shown in FIG. 1.

After step 1420, or after step 1418 if the matrix flag is zero, the master DSP 218 executes steps 1422, 1424, 1426 and 1428 to recover the non-intra quantization matrix from the bit stream, if it exists, and to cause the control processor 226 to process the recovered matrix. These steps perform the same functions as the respective steps 1412 through 1420 described above.

Referring to the syntax diagram of FIG. 6, immediately following the quantization matrix data in the sequence syntax are the extensions and user data. In the MPEG-2 syntax, these data items are introduced by a start code. Accordingly, at step 1430, the master DSP 218 causes the sequencer 216 to execute microcode which retrieves a start code from the bit stream. The microcode for this function and the operations performed by the master DSP for this function are described below with reference to FIG. 15.

When the start code value has been returned, the next step performed by the master DSP 218, step 1432, determines if at least 23 zeros preceded the start code. If not, there is a syntax error in the bit stream and control is transferred, at step 1452, to the error recovery routine 1214 (shown in FIG. 12).

If the start code value was preceded by at least 23 zeros then step 1434 is executed to process the extensions and user data. Since the content of this data varies from one version of MPEG-2 encoded data to another, its decoding depends on the particular version that is received. As described above, the data may be passed by the sequencer 216 to the master DSP 218, the control DSP 226 or the coefficient processor 234. In the exemplary embodiment of the invention, the last steps of the microcode for getting and processing the extensions and user data are microcode, such as steps 4 through 6 of Table 2 which obtains the next start code value from the bit stream.

Following the extensions and user data in the MPEG-2 syntax are data for one or more groups of pictures. As shown in FIG. 7, a record at the group of pictures layer is introduced by a group of pictures start code. At step 1436 in FIG. 14b, the master DSP 218 determines if a group of pictures start code has been returned by the Get And Process Extensions And User Data microcode. If the start code at step 1436 is not a group of pictures start code, control transfers to the error recovery routine via step 1452, as described above.

If, however, a group of pictures start code is found at step 1436, the next step is to process the group of pictures at step 1438. This step is described in detail below with reference to FIGS. 15 through 19.

After processing one group of pictures, the next item in the syntax may be another group of picture. If a group of pictures start code is detected at step 1440 then control returns to step 1438 to process that group of pictures. Otherwise, at step 1440, control transfers to step 1442 to determine if a sequence start code is the next item in the bit stream.

As described above, a sequence is the smallest component of the MPEG-2 bit stream which can be independently decoded. This is required because the sequence header contains data that is needed in the decoding operation. To reduce the delay to produce a recognizable image during initial start-up and channel switching, the MPEG-2 standard allows the sequence header to be repeated at multiple locations in the bit stream. It may be desirable, for example, to insert a sequence header after every two group of pictures records.

If, at step 1442, the next item in the syntax is a sequence start code then control is transferred to step 1410 of FIG. 14a via the connector B, to decode the sequence header information and any group of picture records that follow the header. If, however, no sequence start code is detected at step 1442 then the master DSP 218 determines, at step 1444, if the start code is instead a sequence end code. If a sequence end code is not detected at step 1444, then control transfers to the error recovery routine 1214 of FIG. 12, via step 1452, as described above.

If a sequence end code is detected at step 1444 then the master DSP 128 causes the sequencer 216 and VLD processor 212 to find and return the next start code via the steps 1446 and 1448. These steps are identical to the steps 1430 and 1432 described above. At step 1450, the master DSP 218 determines if the returned start code is a sequence start code. If so, then control transfers to step 1410 via the connector B. Otherwise, there is a syntax error in the MPEG-2 bit stream and the master DSP 218 branches to the error recovery routine 1214 via step 1452.

Figure 15:
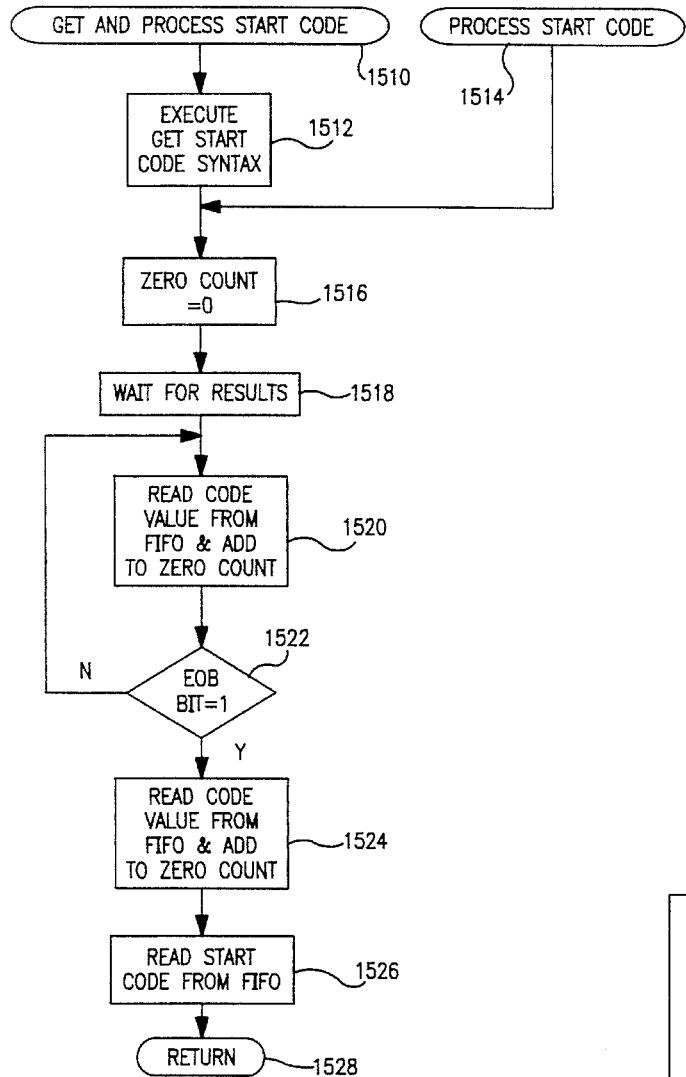
FIG. 15 is a flow chart diagram which illustrates the operation of the routines GET AND PROCESS START CODE and PROCESS START CODE.

FIG. 15 is a flow-chart diagram which illustrates the processing steps performed by the master DSP 218 for the routines GET AND PROCESS START CODE and PROCESS START CODE. In step 1510 of the GET AND PROCESS START CODE routine, the master DSP 218 causes the sequencer 216 and VLD processor 212 to execute the microcode for the Get Start Code syntax. This microcode is the same as steps 4 through 6 of Table 2, described above. In parallel with the execution of this microcode by the sequencer 216, the master DSP 218, at step 1516, sets a variable ZERO COUNT to zero and executes step 1518 to wait for the results of step 1512. Step 1516 is also the entry point for the routine PROCESS START CODE. This routine is used when a start code has already been requested, as described below with reference to FIG. 16.

After the sequencer 216 signals that it has completed its operation at step 1518, control transfers to step 1520. As described above with reference to FIG. 2, in the search for a start code, the sequencer 216 may return several count values representing strings of 14 or less zeros that were encountered in the bit stream. In the queued word containing the final zero count value, an end of block (EOB) bit is set, as described above. As long as the EOB flag is not set in the word that is fetched from the FIFO memory 222, control transfers back to step 1520 to fetch the next code word from the FIFO and add the zero count value contained in the word to the variable ZERO COUNT. When a word having a set EOB flag is encountered, the count value from that word is added to the variable ZERO COUNT at step 1524 and at step 1526, the eight-bit start code value is read from the FIFO memory 222.

Figure 16:
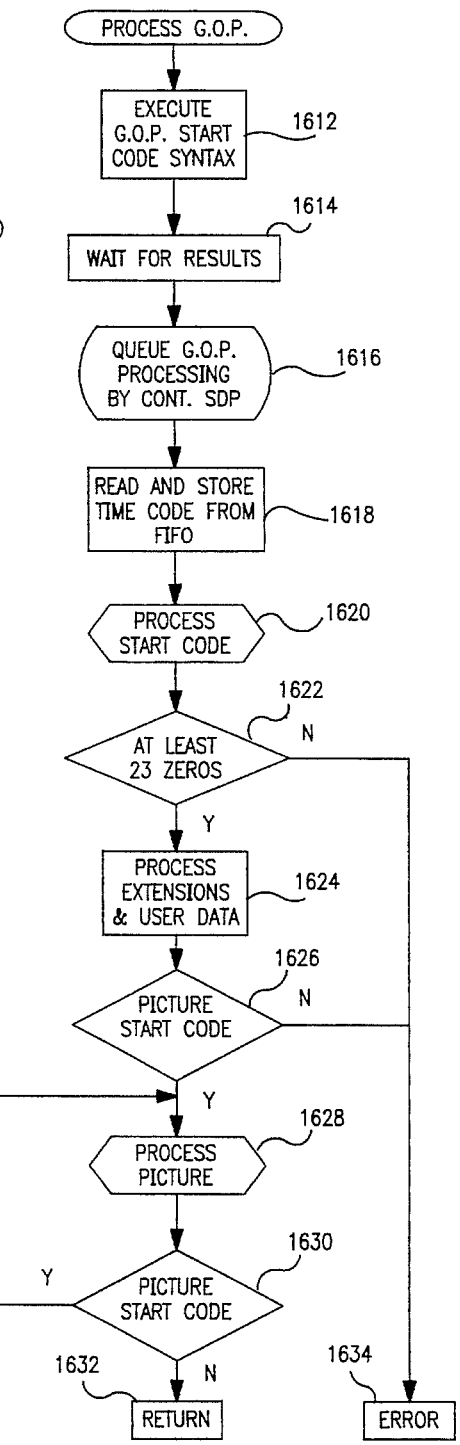
FIG. 16 is a flow chart diagram which illustrates the operation of the PROCESS GROUP OF PICTURES routine shown in FIG. 14b.

FIG. 16 is a flow-chart diagram which shows the steps executed by the master DSP 218 in the PROCESS GROUP 0F PICTURES routine, at step 1438 of FIG. 14b. Referring to FIG. 14b, the group of pictures start code has already been extracted from the bit stream at step 1436. Consequently, the first step in the PROCESS GROUP OF PICTURES routine is to cause the sequencer 216 and VLD processor 212 to execute the group of pictures start syntax. This syntax is shown in Table Table 4.

TABLE 4

| Step | Command | Destination | Mode | Length | Table No. |
|---|---|---|---|---|---|
| 1 | XFER | MD | D | 25 | |
| 2 | XFER | none | D | 1 | |
| 4 | XFER | none | D | 1 | 1E |
| 5 | Xfer to EOB | MD | LNE | | 1E |
| 6 | XFER | MD | D | 8 | |

Referring to the group of pictures syntax diagram shown in FIG. 7, the first three steps of the Execute Group Of Pictures Start syntax extract the time code and the flags CLOSED GROUP and BROKEN LINK. The CLOSED GROUP flag indicates whether the group of pictures is an open group (depending on previously stored frames) or a closed group (depending only on frames within the group). The BROKEN LINK flag is set if frames in the group were deleted or modified during an editing operation. In the exemplary embodiment of the invention, the time code is a 25-bit direct value which is transferred to the master DSP 218. The CLOSED GROUP and BROKEN LINK flags are ignored in this the exemplary embodiment of the invention. Accordingly, these flags are not transferred to any destination.

After processing the header information, the PROCESS GROUP OF PICTURES routine expects to find a start code, either for the extensions and user data or a picture start code. Consequently, steps 5 and 6 of the routine are instructions which transfer a sequence of zero count values and a start code value to the master DSP 218.

Returning to FIG. 16, after step 1612, the next step 1614 waits for the results the execute group of pictures start syntax. When the results have been received, the master DSP 218 notifies the control DSP 226, at step 1616, that a group of pictures is being processed by sending the control DSP a command to process group of pictures data through the circular queue 1222 (shown in FIG. 12). After step 1616, the master DSP 218 executes step 1618 which reads and stores the time code value from the FIFO memory 222. The next item in the FIFO memory 222 is the start code value which was transferred by step 6 of the microcode shown in Table 4. This start code value is processed by the routine PROCESS START CODE, described above with reference to FIG. 15, at step 1620. At step 1622, the master DSP 218 determines if the start code value was preceded by at least 23 zeros. If so, control transfers to step 1624 to process the extensions and user data portion of the group of pictures syntax. This processing is null if there is no extensions and user data portion to be decoded.

If there is an extensions and user data portion, it is processed by the sequencer 216, VLD processor 212, master DSP 218 and, optionally, the control DSP 226. The actual processing steps performed depend on the contents of the extension and user data portion that is defined for the particular MPEG-2 system. It is contemplated, however, that this processing will conclude with the transfer of a start code value from the bit stream to the FIFO 222. If the processing is null, then the previous start code (i.e. a picture start code) remains in the FIFO 222.

If fewer than 23 zeros were found at step 1622, then there is a syntax error in the bit stream and, at step 1634, control is transferred to the error recovery routine 1214 (shown in FIG. 12).

After step 1624, the next item in the syntax should be a picture start code. Step 1626 of the PROCESS GROUP 0F PICTURES routine checks this and, if a picture start code is not found, transfers control to the error recovery routine via step 1634, as described above. If a picture start code is detected at step 1626 then the next step is to process a picture record at step 1628. If the next item in the bit stream, after the picture record is a picture start code, then control transfers to step 1628 to invoke the PROCESS PICTURE ROUTINE to process the picture record. This continues until a start code other than a picture start code is detected following a picture record. In this instance, control returns to step 1440 of the PROCESS SEQUENCE routine shown in FIGS. 14a and 14b.

Figures 17, 18:
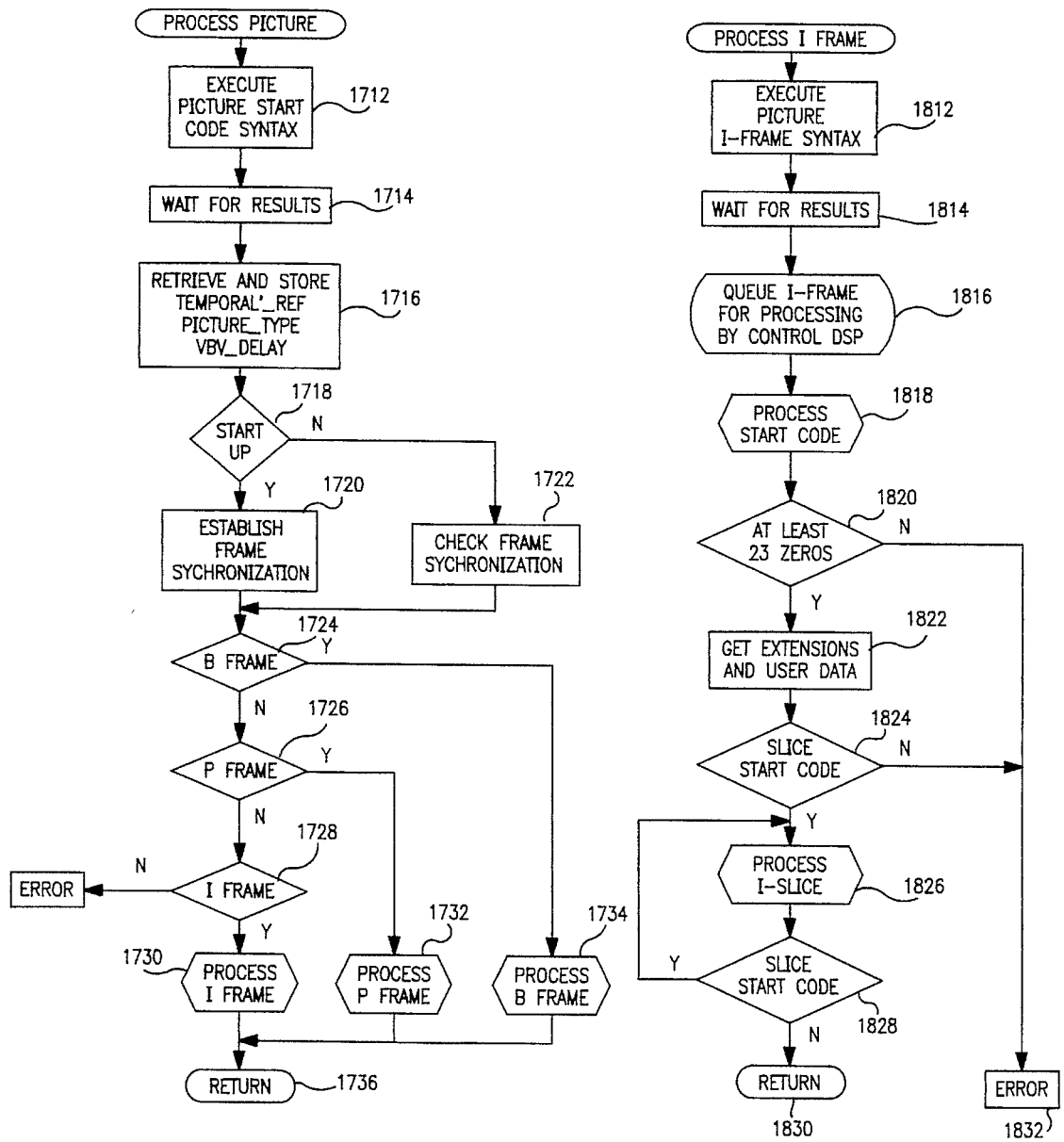
FIG. 17 is a flow chart diagram which illustrates the operation of the PROCESS PICTURE routine shown in FIG. 16.
FIG. 18 is a flow chart diagram which illustrates the operation of the PROCESS I-FRAME routine shown in FIG. 17.

FIG. 17 is a flow-chart diagram which illustrates the operation of the PROCESS PICTURE routine. The first step in this routine, step 1712, causes the sequencer 216 and VLD processor 212 to execute the Picture Start syntax. This syntax, as the Group Of Pictures Start syntax, extracts parameters from the bit stream, as indicated by the syntax of the picture record shown in FIG. 8, These parameters include the 10-bit temporal reference value, the 3-bit picture type value and the 16-bit VBV delay value. All of these values are transferred by the sequencer 216 to the FIFO memory 222 used by the master DSP 218. In addition, the picture type value is transferred to the FIFO memory 224 for use by the control DSP.

The temporal reference value is an unsigned integer value which is set to zero for the first picture in a group of pictures and is incremented by one for each successive picture in the group. The values are assigned in display order. Because the pictures may not be processed in display order, the temporal reference value for successive pictures in a group of pictures may not be consecutive values.

The picture type value indicates whether the picture is intra-frame encoded (an I-frame), predictively encoded (a P-frame) or bidirectionally encoded (a B-frame).

As described above, the vbv delay value indicates an amount of data which is desirably held by the VLD FIFO memory 210 before decoding may begin. If this amount of data is initially in the FIFO memory then the data should be able to be processed continuously, without depleting the FIFO 210.

After executing the picture start syntax at step 1712, the master DSP 218, at step 1714 waits for the results of the execution. At step 1716, the master DSP retrieves the temporal reference value, the picture type value, and the VBV delay value from the FIFO memory 222. Next, at step 1718, the master DSP 218 determines if this is the first picture to be processed by the system after running the INITIALIZE MASTER DSP routine 1210 (shown in FIG. 12). If so, the master DSP 218 executes step 1720 in which it starts all four of the decoders 111a, 111b, 111c and 111d together. In the exemplary embodiment of the invention, this step is performed only by the grand master DSP. It entails sending commands, via the serial bus, to all of the other master DSP's commanding them to begin processing the data stored in their respective VLD FIFO memories.

If this is not the first pass through the PROCESS PICTURE routine, the grand master DSP 218 , at step 1722, checks the progress of the other decoders to ensure that they are all synchronized. This entails sending a message to each of the other master DSPs requesting information on which image frame is being processed. If it is determined that one decoder is ahead of the other decoders, that decoder can be commanded to suspend its operations at this step. The other decoders may be restarted, for example, via step 1722, during a later invocation of the PROCESS PICTURE routine if it is determined that all of the decoders are working on the same frame.

Although, in the exemplary embodiment of the invention, these steps are performed only by the grand master DSP, it is contemplated that similar steps may be performed by each master DSP individually. For example, each master DSP, at steps 1720 and 1722 may poll the other master DSP's to determine which frames are being processed. Upon finding that its decoder is ahead of the other decoders, the one master DSP may temporarily suspend its own operations and set a timer alarm to check whether processing should be resumed at some fixed time in the future.

After the various decoders have been synchronized, at steps 1724, 1726 and 1728, the master DSP 218 checks the picture type value that was retrieved from the bit stream to determine whether the picture is an I-frame, a P-frame or a B-frame. If the picture type does not correspond to one of these types, control is transferred to the error recovery routine 1214 of FIG. 12 via the step 1738. If the picture type indicates that the picture is encoded as an I-frame, P-frame or B-frame, then the respective routine PROCESS I-FRAME 1730, PROCESS P-FRAME 1732 or PROCESS B-FRAME 1734 is executed to decode the picture record. Once the picture has been decoded, control is returned to step 1630 of the PROCESS GROUP OF PICTURES routine, shown in FIG. 16.

To avoid undue repetition, only the path for the PROCESS I-FRAME routine is described below. Relevant differences in processing between I-frames on the one hand and P-frames and B-frames on the other hand are described where relevant. Based on this description and on the materials contained in the above-referenced published MPEG-2 standard, one of ordinary skill in the art of designing real-time digital video signal processing apparatus could readily provide the remaining elements needed to decode MPEG-2 encoded signals.

The PROCESS I FRAME routine is shown in FIG. 18. Steps 1812 and 1814 extract and process the data in the picture header which follows the VBV delay value as it should appear in an intra-frame encoded frame. As shown in FIG. 8, following the VBV delay value are two sets of optional fields which are used to regenerate motion vectors. Since the I-frame is encoded without motion vectors, neither of these sets of fields occurs in the I-frame picture record. If this were a P-frame or a B-frame, the first set of fields representing the full pixel forward motion vector flag and the forward F code value would be recovered by this step. If this were a B-frame, then the second set of fields, representing the full pixel backward motion vector and the backward F code would also be recovered at this step. For P- and B-frames, these values are transferred to the control DSP 226 by the sequencer 216. These values are used by the control DSP 226, as described below, to generate motion vectors for the motion compensation processor 116a. Following these motion vector fields in the I-frame syntax shown in FIG. 8 is a field which holds extra information for future use. In the exemplary embodiment of the invention, this data is discarded at steps 1812 and 1814 of FIG. 18.

After the picture header data has been recovered, the master DSP 218 executes step 1816 to inform the control DSP 226, via the queue 1222, that an I-frame is being processed. The next steps in the process, steps 1818, 1820 and 1822 extract the extension start code and/or the user data start code from the bit stream if one exists, and process the extensions and user data fields of the picture record. Step 1820 transfers control to the error handling routine 1214 (shown in FIG. 12) via step 1832 if a syntax error is detected in the bit stream. Step 1824 is executed after the extension and user data has been recovered at step 1822. This step checks the value returned from the data stream by the microcode at the end of step 1822 to determine if it indicates that a slice start code has been found in the bit stream. If not, then the error handling routine is invoked at step 1832.

If a slice code is found at step 1824, then, at step 1826, the slice is processed by invoking the routine PROCESS I-SLICE at step 1826. Step 1828 determines if another slice follows the one that has just been processed. If so, PROCESS I-SLICE is invoked again at step 1826. This continues until a start code other than the slice start code is encountered in the bit stream. When this occurs, the entire I-frame has been processed and control is returned, at step 1830, to step 1736 of the PROCESS PICTURE routine, shown in FIG. 17.

Figure 11:
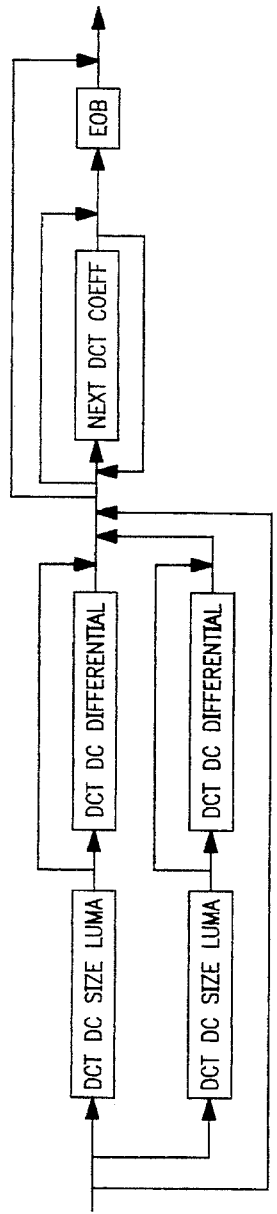
FIG. 11 is a syntax diagram which illustrates the structure of the block layer defined in the MPEG standard.
Figure 19:
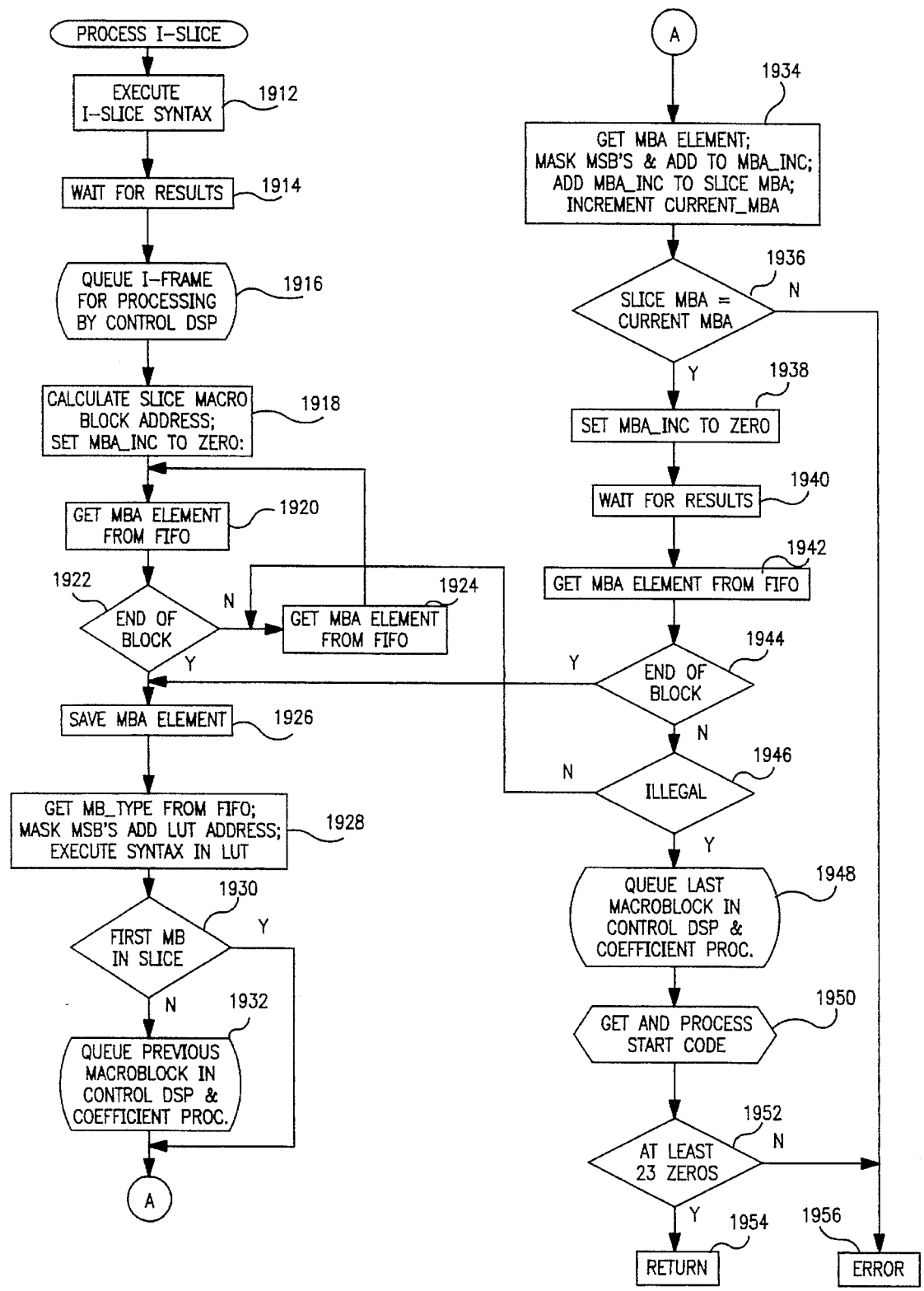
FIG. 19 is a flow chart diagram which illustrates the operation of the PROCESS I-SLICE routine shown in FIG. 18.

FIG. 19 is a flow-chart diagram of the PROCESS I SLICE routine which is invoked at step 1826 of FIG. 18. This routine processes three layers of the MPEG-2 syntax, the slice, macroblock and block layers. In addition to the flowchart diagram of FIG. 19, this description of the operation of the PROCESS I SLICE routine refers to the syntax diagrams for a slice (FIG. 9), a macroblock (FIG. 10) and a block (FIG. 11).

In the first two steps in FIG. 19, steps 1912 and 1914, the master DSP 218 causes the sequencer 216 and VLD processor 212 to extract the slice vertical position, the slice quantization scale factor and the slice extra info (if any exists) from the slice header. The slice vertical position value is transferred to the FIFO memory 222 for use by the master DSP 218 while the quantization scale factor is transferred to the FIFO memory 224 for use by the control DSP 226.

After the header data has been recovered from the bit stream, the master DSP 218, at step 1914, notifies the control DSP 226, via an entry in the circular queue 1222 (shown in FIG. 12) that a slice from an I-frame is being processed. Next, the master DSP calculates the macroblock address (MBA) for the first macroblock in the slice from the slice vertical position information and sets a variable MBA INCREMENT to zero. The algorithm for calculating this address may be found in the referenced MPEG-2 specification document and, so, is not repeated here. Steps 1920, 1922 and 1924 control the sequencer 216 to extract single values from the bit stream. These values are at the start of the macroblock and represent either macroblock stuffing values, which are ignored, or macroblock escape values. The macroblock escape values and the final macroblock address increment are accumulated in the MBA INCREMENT variable, step 1924, to obtain the macroblock address. For this operation, the sequencer 216 and VLD processor 212 are programmed to use a translation table which translates each macroblock escape value into a value of 33 and translates the final macroblock address increment value (MB ADDRESS INC in FIG. 10) into its corresponding increment. When the sequencer encounters the address increment value, it sets the end of block (EOB) bit in the word before transferring address increment value to the FIFO memory 222. This EOB value is detected by the master DSP at step 1922, causing a branch to step 1926 at which the transferred address increment value is saved in a local storage location by the master DSP 218.

Next, at step 1928, the master DSP obtains the macroblock type field from the bit stream. This field (MB TYPE in FIG. 10) is a variable length encoded value. The decoded value represents several flags that describe the macroblock. These flags indicate 1) whether the macroblock uses the macroblock quantizer scale factor (MB Q SCALE in FIG. 10), 2) whether the macroblock uses the forward motion vector information (FWD MV H CODE, FWD MV H RES, FWD MVV CODE and FWD MVV RES in FIG. 10), 3) whether the macroblock uses the backward motion vector information (BWD MV H CODE, BWD MV H RES, BWD MV V CODE and BWD MV V RES in FIG. 10), 4) whether the macroblock has a coded block pattern and, if so, what that pattern is, and 5) whether the macroblock is an intra frame encoded macroblock. Rather than define complex logical processing circuitry which tests each of these flags, the exemplary embodiment of the invention defines a new VLC table for these codes in which the values returned represent the addresses, in the program memory of the sequencer 216, of syntax routines that may be used to decode each possible type of macroblock.

This method of handling the different macroblock types is shown in step 1928. In this step, the macroblock type value is retrieved from the FIFO 222 where it had been placed after being decoded by the sequencer 216 and VLD processor 212. In step 1928, the more significant bits are masked to retrieve only the value portion of the data returned by the processor 212. This value is added to a base look up table (LUT) address and the master DSP 218 then causes the sequencer 218 to execute the syntax routine at that address. In this instance, since the slice being processed is an I-slice, one syntax routine which may be executed is shown in Table 5.

TABLE 5

| Step | Command | Destination | Mode | Length | Table No. |
| --- | --- | --- | --- | --- | --- |
| 1 | NOP | none | D | | 6 |
| 2 | XFER | CFP m = 1 | LNE | | 6 |
| 3 | XFER | CFP m = 3 | D | prev | |
| 4 | Xfer to EOB | CFP m = 2 | LE | | 20 |
| 5 | XFER | CFP m = 1 | LNE | | 6 |
| 6 | XFER | CFP m = 3 | D | prev | |
| 7 | Xfer to EOB | CFP m = 2 | LE | | 20 |
| 8 | XFER | CFP m = 1 | LNE | | 6 |
| 9 | XFER | CFP m = 3 | D | prev | |
| 10 | Xfer to EOB | CFP m = 2 | LE | | 20 |
| 11 | XFER | CFP m = 1 | LNE | | 6 |
| 12 | XFER | CFP m = 3 | D | prev | |
| 13 | Xfer to EOB | CFP m = 2 | LE | | 20 |
| 14 | XFER | CFP m = 1 | LNE | | 7 |
| 15 | XFER | CFP m = 3 | D | prev | |
| 16 | Xfer to EOB | CFP m = 2 | LE | | 20 |
| 17 | XFER | CFP m = 1 | LNE | | 7 |
| 18 | XFER | CFP m = 3 | D | prev | |
| 19 | Xfer to EOB | CFP m = 2 | LE | | 20 |
| 20 | NOP | CFP m = 2 | D | | |
| 21 | NOP | CFP m = 2 | D | | |
| 22 | NOP | CFP m = 2 | D | | |
| 23 | NOP | CFP m = 2 | D | | |
| 24 | NOP | CFP m = 2 | D | | |
| 25 | NOP | CFP m = 2 | D | | |
| 26 | NOP | CFP m = 2 | D | | 1 |
| 27 | SEND | MD | LNE | | 1 |
| 28 | Xfer to EOB | MD | LNE | | 1 |
| 29 | NOP | none | D | | 2 |
| 30 | XFER | MD, CD | LNE | | 2 |

The first instruction of this routine sets up the code table number 6 as the code table to be used by the VLD processor 212. The second instruction extracts a value (DCT DC SIZE LUMA in FIG. 11) which gives the number of bits in the DCT difference value (DCT DC DIFFERENTIAL) which immediately follows the DCT DC SIZE LUMA value in the bit stream. This instruction is transferred to the FIFO memory 220 for use by the coefficient processor (CFP) 234. In addition to sending the value, the sequencer 216 inserts a value of 1 in a mode field in the word that is placed in the FIFO 220. This mode indicates that the value placed in the FIFO 220 is a DCT DC SIZE value. The third instruction of this routine transfers the DCT DC DIFFERENTIAL value from the bit-stream, as a direct value, to the FIFO memory 220 with a mode value that indicates that the value being sent is a DCT DC DIFFERENTIAL value.

In transferring the DCT DC DIFFERENTIAL value, the number of bits indicated by the DCT DC SIZE LUMA value are transferred by the VLD processor 212 and sequencer 216 directly to the FIFO memory 220. It is noted that the DCT DC SIZE value is decoded as look-up no escape (LNE) value. The LNE in the mode field indicates that all possible values of this item are encoded in the variable length code tables and, thus, that there are no escape sequences. After the DCT DC DIFFERENTIAL value is transferred, the sequencer 216 sends the previously sent DCT DC SIZE value back to the VLD decoder 212 to cause the control circuitry 316 (shown in FIG. 3) to eliminate the DCT DC DIFFERENTIAL value from the bit stream. The next step, step 4 of the routine in Table 5, transfers pairs of values representing respective run-lengths and amplitude values (NEXT DCT COEFF in FIG. 11). These pairs of values are used by the coefficient processor 234 to reconstruct the 64 encoded coefficient values for the first block of data in the macroblock from the bit stream to the coefficient processor 234 via the FIFO memory 220. This step uses a variable length code table, 20, to decode the run-length and quantized amplitude values. This table corresponds to table used to decode dct_coeff—first and dct_coeff_next which are defined in the above-referenced MPEG-2 standard. This transfer continues until an end of block code (EOB in FIG. 11) is encountered in the data stream. It is noted that the mode of the VLD processor 212 is lookup escape (LE). In this mode, if any coefficient value does not exist in the variable length code table, it may be sent as an escape sequence, a variable length escape code, followed by an unencoded value in the bit stream. The handling of data in this mode is described above with reference to FIG. 3.

The instructions in steps 3, 4 and 5 are repeated five times in the routine to extract the five other blocks which make up the macroblock. The last two repetitions retrieve data relating to the two color difference blocks, U and V, and, so, a different code table, table 7, is used to obtain the DCT DC SIZE value for these blocks. The commands from step 20 through step 26 transfer zeros to the coefficient processor as fillers which are needed in the exemplary embodiment of the invention. It is contemplated that these commands could be deleted with by making a minor modification to the exemplary coefficient processor 234. The commands after step 26 obtain information for the next macroblock in the bit stream, if one exists. These commands space over any macro block stuffing fields, extract any macroblock escape fields, the macroblock address increment field and the macroblock type field. The macroblock escape fields and the macroblock address increment fields are passed to the FIFO memory 222 for use by the master DSP 218. The macroblock type field is sent to both the FIFO memory 222 and to the FIFO memory 224 for use by the control DSP 226.

Returning to FIG. 19, after step 1928, the master DSP 218 determines, at step 1930, if the macroblock that is currently being processed is the first macroblock in the slice. If so, control transfers to step 1934 via connector A. If this is not the first macroblock, the master DSP queues commands to process the previous macroblock in both the control DSP 226 and in the coefficient processor 234.

Steps 1934, 1936, 1938, 1940 and 1942 extract the next macroblock from the bit stream in the same manner described above. At step 1944 when the master DSP 218 encounters an end of block code in the values fetched from the FIFO memory 222, it transfers control to step 1926 to fetch the next macroblock from the slice record. If there is no end of block at step 1944 but the illegal flag is set at step 1946, then there are no more macroblocks in the slice. At step 1948, the master DSP queues commands for processing of the last macroblock in the slice in both of the circular queues 1220 and 1222 for the respective coefficient processor 234 and control DSP 226. Finally, at steps 1950 and 1952, the PROCESS I-SLICE routine extracts and validates a start code from the bit stream and returns control, at step 1954, to step 1828 of the PROCESS I-FRAME routine, shown in FIG. 18. If the control DSP 218 detects a syntax error in the bit stream at step 1936 or at step 1952, control is transferred, at step 1956, to the error recovery routine 1214 (shown in FIG. 12).

The material presented above describes the operation of the exemplary MPEG-2 VLC decoder in the processing of an I-frame. The processing steps performed for P-frames and B-frames is similar, except that these frames also include motion vector information in their macroblock headers. In the syntax routines for processing the macroblock headers for P-frames and B-frames, the motion vector data is extracted from the macroblock headers and transferred to the FIFO memory 224 for use by the control DSP 226. The control DSP decodes and combines this data with the motion vector data previously extracted from the header for the picture layer. The algorithms for decoding and processing this data are described in the above-referenced MPEG-2 standard and, so, are not described herein.

In the exemplary embodiment of the invention, the coefficient processor 234 and the control DSP 226 perform only those functions which are requested by the master DSP 218 via the respective circular queues 1220 and 1222, respectively. When, for example, each of these devices retrieves a command from the queue requesting that the data for the previous block be sent to the rest of the system, the coefficient processor 234 transfers the data to the FIFO memory 236 and the control DSP transfers the data to the FIFO 230. The control processor 232 reads the data from the FIFO memory 230 and transfers it to the IDCT processor 114a and to the motion compensation processor 116a as commanded directly by the master DSP 218. By monitoring the fullness of the FIFO memories 230 and 236, of all of the VLD decoders 111a, 111b, 111c and 111d, the master DSP 218, acting as the grand master DSP, can hold the entire decoder in synchronism and can ensure that the decoding operations do not get ahead of the display operations.

While the invention has been described in terms of an exemplary embodiment, it is contemplated that it may be practiced as outlined above within the spirit and scope of the appended claims.

The invention claimed is:

1. Apparatus for decoding a data stream including a plurality of variable length encoded data values, wherein the data stream conforms to a predetermined syntax including a portion representing control information, the apparatus comprising:

decoding means, coupled to receive the variable length encoded data stream and responsive to a first control signal, for converting each variable length encoded value in the data stream into a corresponding decoded value;

master processing means, coupled to receive decoded values provided by the decoding means, for generating, from the received values, the first control signal for the decoding means and a second control signal, different than the first control signal; and control processing means, responsive to said second control signal, coupled to receive decoded values provided by the decoding means representing the control information of the data stream and for processing the received values to divide the received control information into first and second data types, concurrently with the processing performed by the decoding means and the master processing means.

2. Apparatus according to claim 1 further including a first-in first-out (FIFO) memory having an input port coupled to receive the data stream and an output port coupled to provide the data stream to the decoding means at a rate determined by the decoding means.

3. Apparatus for decoding a data stream including a plurality of variable length encoded data values, wherein the data stream conforms to a predetermined syntax including a portion representing control information, the apparatus comprising:

decoding means, coupled to receive the variable length encoded data stream and responsive to a control signal, for converting each variable length encoded value in the data stream into a corresponding decoded value, wherein the decoding means includes sequencing means for executing preprogrammed routines responsive to the control signal;

master processing means, coupled to receive decoded values provided by the decoding means, for generating, from the received values, the control signal for the decoding means; and control processing means, coupled to receive decoded values provided by the decoding means representing the control information of the data stream and for processing the received values, concurrently with the processing performed by the decoding means and the master processing means.

4. Apparatus for decoding a data stream including a plurality of variable length encoded data values, wherein the data stream conforms to a predetermined syntax including a portion representing control information and a data portion in addition to the control information, the apparatus comprising:

decoding means, coupled to receive the variable length encoded data stream and responsive to a control signal, for converting each variable length encoded value in the data stream into a corresponding decoded value;

master processing means, coupled to receive decoded values provided by the decoding means, for generating, from the received values, the control signal for the decoding means;

control processing means, coupled to receive decoded values provided by the decoding means representing the control information of the data stream and for processing the received values, concurrently with the processing performed by the decoding means and the master processing means; and data processing means, coupled to receive the decoded values provided by the decoding means representing the data portion of the data stream.

5. Apparatus according to claim 4, further comprising:

first further FIFO memory means for receiving the decoded values representing the control information of the data stream, as provided by the decoding means and for providing the received values to the master processing means, at a rate determined by the master processing means;

second further FIFO memory means, for receiving the decoded values, representing the control portion of the data stream, as provided by the decoding means and for providing the received values to the control processing means, at a rate determined by the control processing means; and third further FIFO memory means, for receiving the decoded values, representing the data portion of the data stream, as provided by the decoding means and for providing the received data values to the data processing means at a rate determined by the data processing means.

6. Apparatus according to claim 5, further including:

means, coupled between the master processing means and the control processing means for conveying commands from the master processing means to the control processing means, wherein the control processing means is responsive to the commands in processing the decoded data values representing the control information of the data stream; and means, coupled between the master processing means and the data processing means for conveying commands from the master processing means to the data processing means, wherein the data processing means is responsive to the commands in processing the decoded data values representing the data portion of the data stream.

7. Apparatus for decoding a digital data stream representing an encoded video signal which has been encoded using motion compensated encoding techniques, said data stream including a plurality of variable length encoded data values, wherein the data stream conforms to a predetermined syntax and includes a portion representing motion vectors to be used to decode the motion compensated coded data, the apparatus comprising:

decoding means, coupled to receive the variable length encoded data stream and responsive to a control signal, for converting each variable length encoded value in the data stream into a corresponding decoded value;

master processing means, coupled to receive decoded values provided by the decoding means, for generating, from the received values, the control signal for the decoding means; and control processing means, coupled to receive decoded values provided by the decoding means representing the control information of the data stream and for processing the received values to recover the encoded motion vectors therefrom, concurrently with the processing performed by the decoding means and the master processing means.

8. Apparatus according to claim 7 further including a first-in first-out (FIFO) memory having an input port coupled to receive the digital data stream and an output port coupled to provide the digital data stream to the decoding means at a rate determined by the decoding means.

9. Apparatus according to claim 8, wherein the decoding means includes sequencing means for executing preprogrammed routines responsive to the control signals provided by the master processing means.

10. Apparatus according to claim 9 wherein the data stream includes a data portion representing video image data in addition to the control information and the apparatus further comprises image data processing means, coupled to receive the decoded values provided by the decoding means representing the image data portion of the digital data stream.

11. Apparatus according to claim 10, further comprising:

first further FIFO memory means, for receiving ones of the decoded values, representing data flow control information of the data stream, as provided by the decoding means and for providing the received values to the master processing means, at a rate determined by the master processing means;

second further FIFO memory means, for receiving the decoded values, representing the motion vectors, as provided by the decoding means and for providing the received values to the control processing means, at a rate determined by the control processing means; and third further FIFO memory means, for receiving the decoded values, representing the video data portion of the data stream, as provided by the decoding means and for providing the received data values to the video data processing means at a rate determined by the data processing means.

12. Apparatus according to claim 11, further including:

means, coupled between the master processing means and the control processing means for conveying commands from the master processing means to the control processing means, wherein the control processing means is responsive to the commands for processing the decoded data values representing the motion vectors; and means, coupled between the master processing means and the video data processing means for conveying commands from the master processing means to the video data processing means, wherein the video data processing means is responsive to the commands for processing the decoded data values representing the video data portion of the data stream.

13. Apparatus for decoding a data stream including a plurality of variable length encoded data values, wherein the data stream conforms to a predetermined syntax including a portion representing control information, the apparatus comprising:

means for dividing the data stream into N segments, where N is an integer;

N decoding means, each coupled to receive a respectively different one of the N segments of the variable length encoded data stream and responsive to a control signal, for converting each variable length encoded value in the segment into a corresponding decoded value;

N master processing means, each coupled to receive decoded values provided by a respectively different one of the decoding means, for generating, from the received values, the control signal for the decoding means; and N control processing means, each coupled to receive decoded values provided by a respectively different one of the decoding means representing the control information of the data stream and for processing the received values, concurrently with the processing performed by the decoding means and the master processing means.

14. Apparatus according to claim 13 wherein one of the N master processing means, further includes means for communicating with each of the other N–1 master processing means to synchronize the N master processing means, N decoding means and N control processing means.

* * * * *